United States Patent
Kazuno

(10) Patent No.: US 12,348,211 B2
(45) Date of Patent: Jul. 1, 2025

(54) COMBINING BALUN AND DIFFERENTIAL AMPLIFICATION DEVICE

(71) Applicant: Murata Manufacturing Co., Ltd., Kyoto (JP)

(72) Inventor: Masafumi Kazuno, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 780 days.

(21) Appl. No.: 17/648,613

(22) Filed: Jan. 21, 2022

(65) Prior Publication Data

US 2022/0239273 A1   Jul. 28, 2022

(30) Foreign Application Priority Data

Jan. 22, 2021 (JP) ................................ 2021-008674

(51) Int. Cl.
- *H03F 3/45* (2006.01)
- *H01P 5/19* (2006.01)
- *H03H 7/42* (2006.01)

(52) U.S. Cl.
CPC ............... *H03H 7/42* (2013.01); *H01P 5/19* (2013.01); *H03F 3/45475* (2013.01); *H03F 2200/09* (2013.01); *H03F 2200/451* (2013.01)

(58) Field of Classification Search
CPC .. H03H 7/42; H03H 11/32; H01P 5/19; H01P 5/12; H01P 5/10; H03F 3/45475; H03F 2200/09; H03F 2200/451; H03F 3/193; H03F 3/211; H03F 3/195; H03F 3/213; H03F 3/45928

USPC ...................... 330/252, 253, 124 R, 295, 195
See application file for complete search history.

(56) References Cited

U.S. PATENT DOCUMENTS

| 8,674,764 B2 * | 3/2014 | Kondo .................... H03F 3/245 330/252 |
| 2011/0063028 A1 | 3/2011 | Kawakami et al. |

FOREIGN PATENT DOCUMENTS

JP          2011-066599 A          3/2011

OTHER PUBLICATIONS

Zhao et al., "Analysis and Design of CMOS Doherty Power Amplifier Based on Voltage Combining Method", IEEE Access, Mar. 6, 2017, vol. 5, pp. 5001-5012.

(Continued)

*Primary Examiner* — Andrea Lindgren Baltzell
*Assistant Examiner* — Khiem D Nguyen
(74) *Attorney, Agent, or Firm* — McDonald Hopkins LLC

(57) ABSTRACT

A combining balun includes: a first input side conductive member wound around a first axis on a first surface, which intersects with the first axis, and has a first portion between a second axis and the first axis and through which a first input current flows; a second input side conductive member wound around the second axis on the first surface and has a second portion between the second axis and the first portion and through which a second input current flows; a first output side conductive member wound around the first axis on a second surface, which faces the first surface, and has a third portion which faces the first portion; and a second output side conductive member wound around the second axis on the second surface and has a fourth portion which faces the second portion.

11 Claims, 19 Drawing Sheets

(56) References Cited

OTHER PUBLICATIONS

Zhao et al., "Analysis and Design of CMOS Doherty Power Amplifier Using Voltage Combining Method", [online], Apr. 14-18, 2013, 2013 IEEE International Wireless Symposium (IWS), [searched on Nov. 19, 2020]. Retrieved from the Internet <URL: https://ieeexplore.ieee.org/abstract/document/6616725>.

* cited by examiner

COMBINING BALUN AND DIFFERENTIAL AMPLIFICATION DEVICE

CROSS REFERENCE TO RELATED APPLICATION

This application claims priority from Japanese Patent Application No. 2021-008674 filed on Jan. 22, 2021. The content of this application is incorporated herein by reference in its entirety.

BACKGROUND

The present invention relates to a combining balun and a differential amplification device.

There is a power amplification device that combines output power of a plurality of amplifier pairs with use of a transformer (see, for example, Japanese Unexamined Patent Application Publication No. 2011-66599). Further, there is a technique in which each of peaking amplifiers and carrier amplifiers is composed of a pair of differential amplifiers and output power of the amplifier pair of the peaking amplifier side and output power of the amplifier pair of the carrier amplifier side are combined with each other by a transformer, in a Doherty amplifier (see, for example, Chenxi Zhao and three others, "Analysis and Design of CMOS Doherty Power Amplifier Based on Voltage Combining Method", IEEE Access, the U.S., IEEE, Mar. 6, 2017, Vol. 5, pp. 5001-5012, and Chenxi Zhao and three others, "Analysis and Design of CMOS Doherty Power Amplifier Using Voltage Combining Method", (online), 14-18 Apr. 2013, 2013 IEEE International Wireless Symposium (IWS), (searched on Nov. 19, 2020, Internet ieeexplore.ieee.org/abstract/document/6616725).

BRIEF SUMMARY

In the power amplification device described in Japanese Unexamined Patent Application Publication No. 2011-66599 and the Doherty amplifiers described in "Analysis and Design of CMOS Doherty Power Amplifier Based on Voltage Combining Method" and "Analysis and Design of CMOS Doherty Power Amplifier Using Voltage Combining Method", two inductors are provided on the input side of the transformer and two signals having opposite phases and the same amplitudes are supplied to both ends of these respective inductors.

In these two inductors, for example, the direction of a magnetic field generated in one inductor is sometimes opposite to the direction of a magnetic field generated in the other inductor. In this case, the magnetic fields sometimes cancel each other out and efficiency in conversion from a differential signal into a single phase signal is sometimes degraded.

The present invention provides a combining balun and a differential amplification device that suppress efficiency degradation in converting from a differential signal to a single phase signal.

A combining balun according to one aspect of the present invention includes: a first input side conductive member that is wound around a first axis on a first surface, which intersects with the first axis, and has a first portion which is positioned between a second axis, which is substantially parallel to the first axis, and the first axis and through which a first input current flows; a second input side conductive member that is wound around the second axis on the first surface and has a second portion which is positioned between the second axis and the first portion and through which a second input current flows in a same direction as a direction of the first input current; a first output side conductive member that is wound around the first axis on a second surface, which faces the first surface, and has a third portion which faces the first portion; a second output side conductive member that is wound around the second axis on the second surface and has a fourth portion which faces the second portion; and a first output terminal that outputs a current or a voltage, which is generated in the first output side conductive member and the second output side conductive member, based on the first input current and the second input current.

According to the present invention, a combining balun and a differential amplification device that suppress efficiency degradation in converting from a differential signal to a single phase signal can be provided.

BRIEF DESCRIPTION OF THE DRAWINGS

FIG. 11 illustrates an example of a layout of the upper inductor set 50a and an upper inductor set 150a;

DETAILED DESCRIPTION

Figure 1:
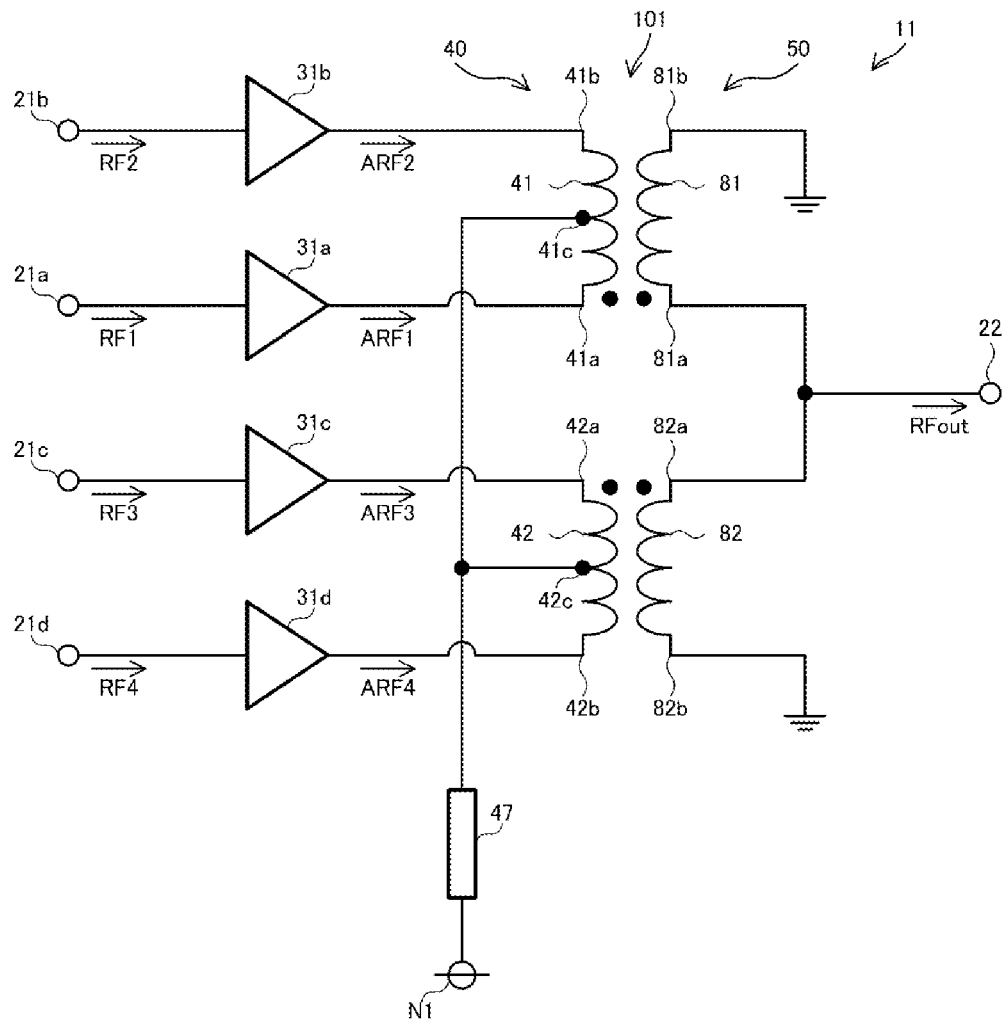
FIG. 1 is a circuit diagram of a differential amplification circuit 11.

Embodiments according to the present invention will be described in detail below with reference to the accompanying drawings. Here, the mutually-same components will be provided with the same reference characters and duplicate description thereof will be omitted as much as possible.

First Embodiment

A differential amplification device according to a first embodiment will be described.

FIG. 1 is a circuit diagram of a differential amplification circuit 11. As illustrated in FIG. 1, the differential amplification circuit 11 is a circuit provided to the differential amplification device and includes a first amplifier 31a, a second amplifier 31b, a third amplifier 31c, a fourth amplifier 31d, an inductor 47, and a current combining balun 101. The current combining balun 101 includes an input unit 40 and an output unit 50. The input unit 40 includes a first input side inductor 41 (first input side conductive member) and a second input side inductor 42 (second input side conductive member). The output unit 50 includes an output side inductor 81 and an output side inductor 82.

The differential amplification circuit 11 amplifies a first differential signal and a second differential signal and converts the first differential signal and the second differential signal, which are subjected to the amplification, into two respective single end signals (single phase signals). Then, the differential amplification circuit 11 outputs an output signal RFout that is obtained by combining these single end signals from an output terminal 22. Here, each of the differential signals is, for example, a radio frequency signal.

More specifically, the first differential signal is composed of a first signal RF1 and a second signal RF2 that has a different phase from that of the first signal RF1. Specifically, the phase of the first signal RF1 is different from the phase of the second signal RF2 by approximately 180°, for example. The first signal RF1 and the second signal RF2 are generated by, for example, a balun that is provided on the previous stage of the differential amplification circuit 11.

The second differential signal is composed of a third signal RF3 that has substantially the same phase as that of the first signal RF1 and a fourth signal RF4 that has substantially the same phase as that of the second signal RF2. As the phase of the first signal RF1 and the phase of the second signal RF2 are different from each other by approximately 180° as described above, the phase of the third signal RF3 and the phase of the fourth signal RF4 are different from each other by, for example, approximately 180°. The third signal RF3 and the fourth signal RF4 are generated by, for example, a balun that is provided on the previous stage of the differential amplification circuit 11.

The first amplifier 31a, the second amplifier 31b, the third amplifier 31c, and the fourth amplifier 31d are composed, for example, of a bipolar transistor such as a heterojunction bipolar transistor (HBT). However, these amplifiers may be composed of a field effect transistor (FET).

The first amplifier 31a has an input terminal, which is connected with an input terminal 21a, and an output terminal. The first amplifier 31a amplifies the first signal RF1 supplied to the input terminal thereof through the input terminal 21a and outputs a first amplified signal ARF1 from the output terminal thereof.

The second amplifier 31b has an input terminal, which is connected with an input terminal 21b, and an output terminal. The second amplifier 31b amplifies the second signal RF2 supplied to the input terminal thereof through the input terminal 21b and outputs a second amplified signal ARF2 from the output terminal thereof.

The third amplifier 31c has an input terminal, which is connected with an input terminal 21c, and an output terminal. The third amplifier 31c amplifies the third signal RF3 supplied to the input terminal thereof through the input terminal 21c and outputs a third amplified signal ARF3 from the output terminal thereof.

The fourth amplifier 31d has an input terminal, which is connected with an input terminal 21d, and an output terminal. The fourth amplifier 31d amplifies the fourth signal RF4 supplied to the input terminal thereof through the input terminal 21d and outputs a fourth amplified signal ARF4 from the output terminal thereof.

In the current combining balun 101, the first input side inductor 41 in the input unit 40 has a first end 41a, a second end 41b, and an intermediate tap 41c. The first end 41a is connected with the output terminal of the first amplifier 31a. The second end 41b is connected with the output terminal of the second amplifier 31b. The intermediate tap 41c is connected with a power source voltage supply node N1 via the inductor 47. The first amplifier 31a and the second amplifier 31b perform an amplification operation by using a voltage received from the power source voltage supply node N1 via the inductor 47 and the intermediate tap 41c.

The output side inductor 81 in the output unit 50 is electromagnetically coupled mainly with the first input side inductor 41 and generates an output current based on an electromagnetic field that is generated by the first amplified signal ARF1 and the second amplified signal ARF2 which are supplied to the first input side inductor 41. The output current will be described in detail later. In the present embodiment, the output side inductor 81 has a first end 81a, which is connected with the output terminal 22, and a second end 81b which is grounded. Described in detail later, the output side inductor 81 is configured by connecting two inductors in series.

The second input side inductor 42 in the input unit 40 is a similar inductor to the first input side inductor 41. Specifically, the second input side inductor 42 has a first end 42a, a second end 42b, and an intermediate tap 42c. The first end 42a is connected with the output terminal of the third amplifier 31c. The second end 42b is connected with the output terminal of the fourth amplifier 31d. The intermediate tap 42c is connected with the power source voltage supply node N1 via the inductor 47. The third amplifier 31c and the fourth amplifier 31d perform an amplification operation by using a voltage received from the power source voltage supply node N1 via the inductor 47 and the intermediate tap 42c.

The output side inductor 82 in the output unit 50 is electromagnetically coupled mainly with the second input side inductor 42 and generates an output current based on an electromagnetic field that is generated by the third amplified signal ARF3 and the fourth amplified signal ARF4 which are supplied to the second input side inductor 42. The output current will be described in detail later. In the present embodiment, the output side inductor 82 is a similar inductor to the output side inductor 81 and has a first end 82a, which is connected with the output terminal 22, and a second end 82b which is grounded. Described in detail later, the output side inductor 82 is configured by connecting two inductors in series.

[Layout]

A layout of the differential amplification circuit 11 will be described. Some drawings show some of an x axis, a y axis, and a z axis. The x axis, the y axis, and the z axis form a three-dimensional orthogonal coordinate of right-hand system. Hereinafter, an arrow direction of the z axis is sometimes referred to as a z-axis positive side and an opposite direction to the arrow is sometimes referred to as a z-axis negative side. The same is applied to the rest of the axes. Here, the z-axis positive side and the z-axis negative side are sometimes referred to as "upper" and "lower" respectively.

Figure 2:
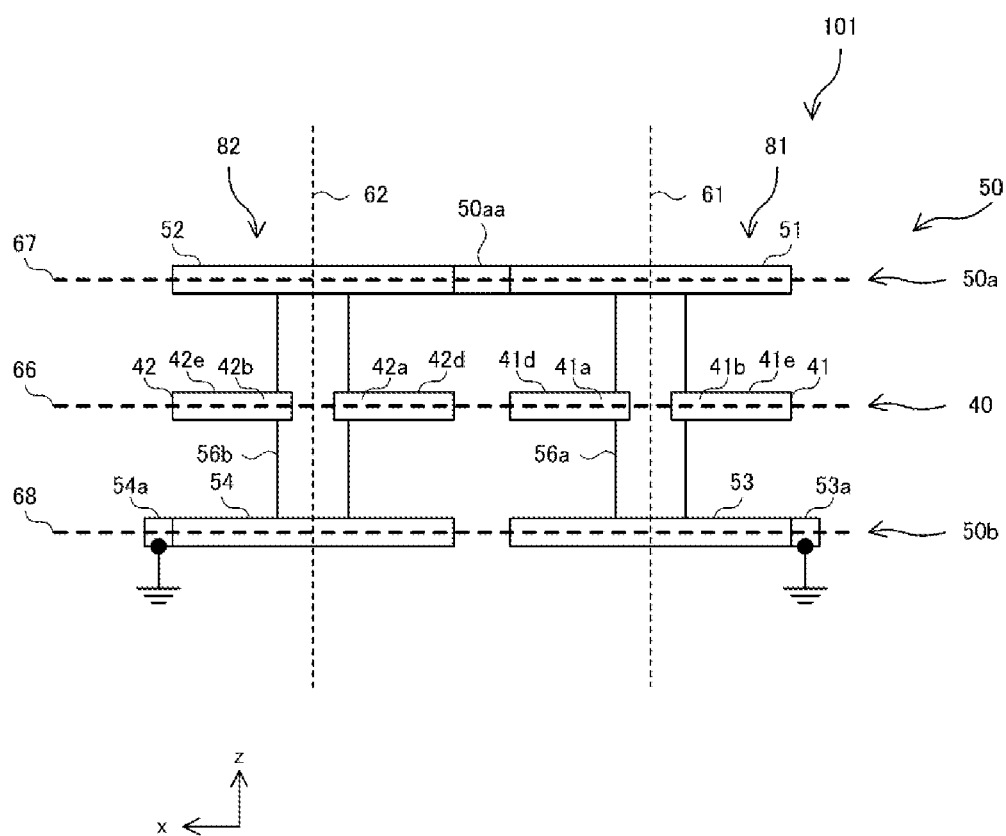
FIG. 2 is a plan view of a current combining balun 101.
Figure 3:
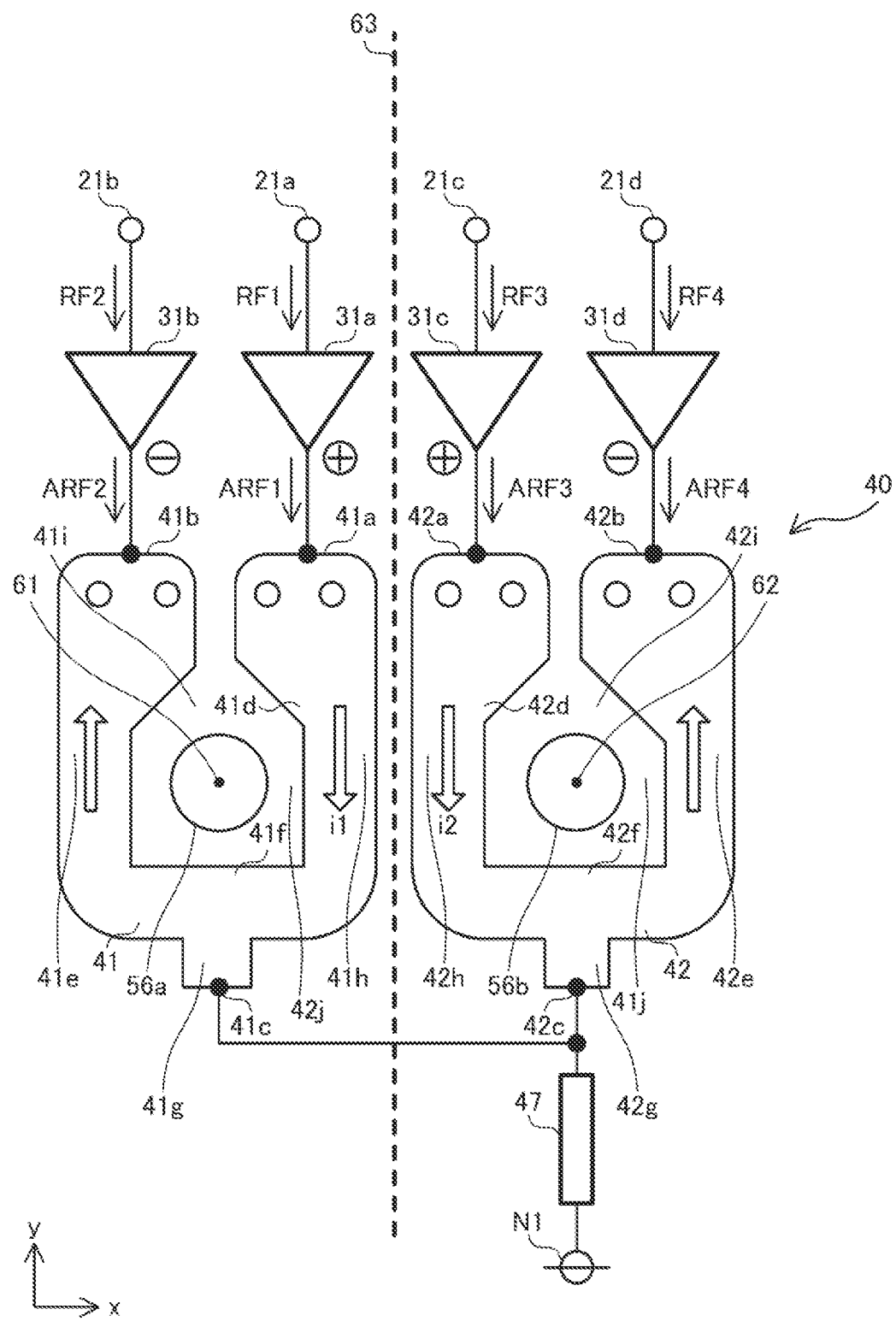
FIG. 3 illustrates an example of a layout of an input unit 40 in the current combining balun 101.
Figure 4:
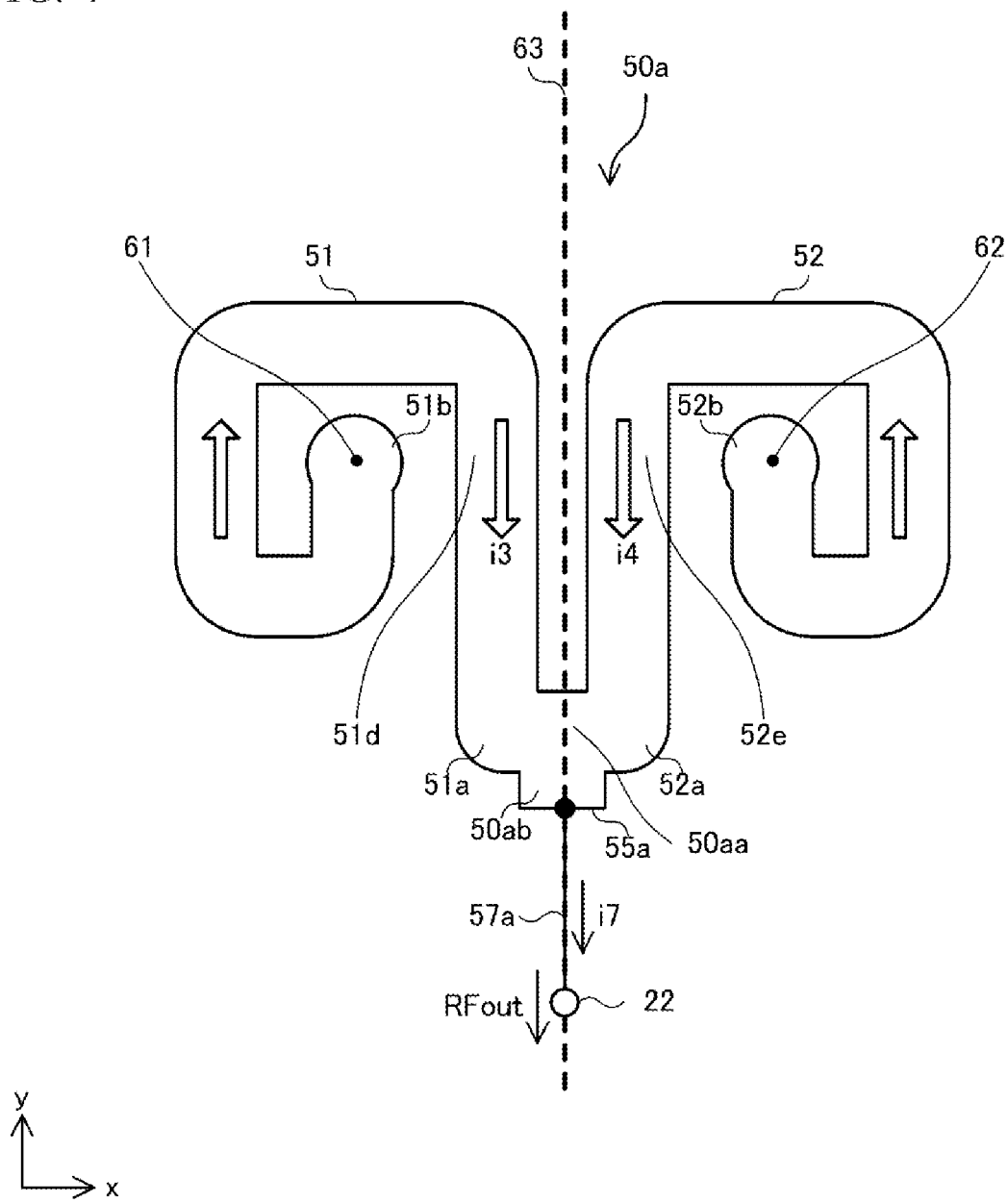
FIG. 4 illustrates an example of a layout of an upper inductor set 50a in the current combining balun 101.
Figure 5:
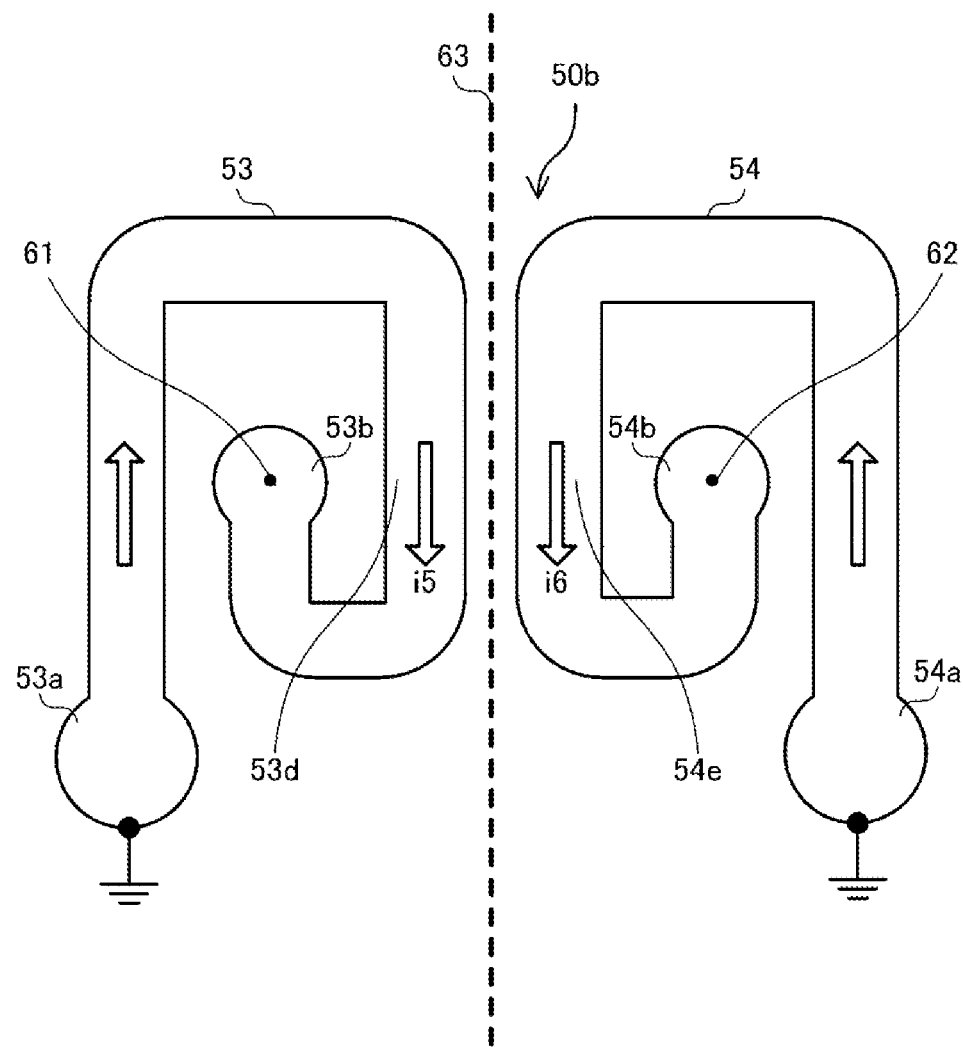
FIG. 5 illustrates an example of a layout of a lower inductor set 50b in the current combining balun 101.

FIG. 2 is a plan view illustrating the current combining balun 101 viewed from the y-axis positive side. FIG. 3 illustrates an example of a layout of the input unit 40 in the current combining balun 101. FIG. 4 illustrates an example of a layout of an upper inductor set 50a in the current combining balun 101. FIG. 5 illustrates an example of a layout of a lower inductor set 50b in the current combining balun 101.

FIGS. 3 to 5 are plan views obtained by viewing the input unit 40, the upper inductor set 50a, and the lower inductor set 50b from the z-axis positive side respectively. Here, FIG. 3 illustrates the first amplifier 31a, the second amplifier 31b, the third amplifier 31c, the fourth amplifier 31d, and the inductor 47 in a schematic manner.

The output unit 50 includes the upper inductor set 50a and the lower inductor set 50b as illustrated in FIGS. 2 to 5. Each of a first axis 61 and a second axis 62 is substantially parallel to the z axis. The second axis 62 is positioned on the x-axis positive side of the first axis 61 with a certain interval from the first axis 61. The direction from the first axis 61 toward the second axis 62 (sometimes referred to as a first direction hereinafter) is substantially the same as the x-axis direction. Here, the first axis 61 and the second axis 62 are virtual axes for facilitating deeper understanding with respect to the invention and they are accordingly not provided to actual products.

Each of a first surface 66, a second surface 67, and a third surface 68, which are illustrated in FIG. 2, intersects with the first axis 61 and the second axis 62 substantially orthogonally. The second surface 67 faces the first surface 66 and is positioned above the first surface 66. The third surface 68 is opposed to the second surface 67 with the first surface 66 interposed therebetween and is positioned below the first surface 66. An interval between the first surface 66 and the second surface 67 is substantially the same as an interval between the first surface 66 and the third surface 68, for example.

The input unit 40 illustrated in FIGS. 2 and 3 is provided on a second layer along the first surface 66. The upper inductor set 50a illustrated in FIGS. 2 and 4 is provided on a first layer along the second surface 67. The lower inductor set 50b illustrated in FIGS. 2 and 5 is provided on a third layer along the third surface 68.

In the present embodiment, the first amplifier 31a, the second amplifier 31b, the third amplifier 31c, and the fourth amplifier 31d are provided, for example, on the second layer in an order of the second amplifier 31b, the first amplifier 31a, the third amplifier 31c, and the fourth amplifier 31d toward the x-axis positive side (see FIG. 3).

The first input side inductor 41 in the input unit 40 illustrated in FIG. 3 is wound around the first axis 61. The first input side inductor 41 is wound around the first axis 61 by substantially a half circumference, in the present embodiment. Specifically, the first input side inductor 41 is provided on the y-axis negative side of the second amplifier 31b and the first amplifier 31a and includes a positive side extending portion 41d, a negative side extending portion 41e, a coupling portion 41f, and a protruding portion 41g.

More specifically, the positive side extending portion 41d is positioned on the y-axis negative side of the first amplifier 31a and between the first axis 61 and the second axis 62. The positive side extending portion 41d has a shape that extends from the first end 41a, connected with the output terminal of the first amplifier 31a, toward the y-axis negative side.

The negative side extending portion 41e is positioned on the y-axis negative side of the second amplifier 31b and on an opposite side of the positive side extending portion 41d about the first axis 61 used as a reference. The negative side extending portion 41e has a shape that extends from the second end 41b, connected with the output terminal of the second amplifier 31b, toward the y-axis negative side.

The coupling portion 41f is positioned on the y-axis negative side of the first axis 61 and has a shape that extends in substantially parallel to the x-axis direction. The coupling portion 41f couples an end portion on the y-axis negative side of the positive side extending portion 41d and an end portion on the y-axis negative side of the negative side extending portion 41e to each other.

The protruding portion 41g has a shape that protrudes from an intermediate point between both end portions of the coupling portion 41f toward the y-axis negative side and functions as the intermediate tap 41c. The first input side inductor 41 has a U shape that is opened in a direction directed from the y-axis negative side toward the y-axis positive side (sometimes referred to as a second direction hereinafter) as a whole.

The second input side inductor 42 illustrated in FIG. 3 is wound around the second axis 62. The second input side inductor 42 is wound around the second axis 62 by substantially a half circumference, in the present embodiment. Specifically, the second input side inductor 42 is provided on the y-axis negative side of the third amplifier 31c and the fourth amplifier 31d and includes a positive side extending portion 42d, a negative side extending portion 42e, a coupling portion 42f, and a protruding portion 42g.

The second input side inductor 42 has a shape that is substantially symmetrical to the first input side inductor 41 across a symmetry plane 63. Here, the symmetry plane 63 is positioned between the first axis 61 and the second axis 62 and is a plane that is substantially parallel to the yz plane. That is, the second input side inductor 42 is positioned on the x-axis positive side of the first input side inductor 41 and has a U shape that is opened in the second direction as a whole. The symmetry plane 63 is a virtual plane for facilitating better understanding with respect to the invention and the symmetry plane 63 is accordingly not provided to actual products.

More specifically, the positive side extending portion 42d is positioned on the y-axis negative side of the third amplifier 31c and between the positive side extending portion 41d of the first input side inductor 41 and the second axis 62. The positive side extending portion 42d has a shape that extends from the first end 42a, connected with the output terminal of the third amplifier 31c, toward the y-axis negative side.

The negative side extending portion 42e is positioned on the y-axis negative side of the fourth amplifier 31d and on an opposite side of the positive side extending portion 42d about the second axis 62 used as a reference. The negative side extending portion 42e has a shape that extends from the second end 42b, connected with the output terminal of the fourth amplifier 31d, toward the y-axis negative side.

The coupling portion 42f is positioned on the y-axis negative side of the second axis 62 and has a shape that extends in substantially parallel to the x-axis direction. The coupling portion 42f couples an end portion on the y-axis negative side of the positive side extending portion 42d and an end portion on the y-axis negative side of the negative side extending portion 42e to each other.

The protruding portion 42g has a shape that protrudes from an intermediate point between both end portions of the coupling portion 42f toward the y-axis negative side and functions as the intermediate tap 42c.

In the positive side extending portion 41d of the first input side inductor 41, more specifically, in a first portion 41h positioned between the first axis 61 and the second axis 62 in the positive side extending portion 41d, a first input current i1 flows based on the first amplified signal ARF1 and the second amplified signal ARF2 supplied from the first amplifier 31a and the second amplifier 31b respectively.

In the positive side extending portion 42d of the second input side inductor 42, more specifically, in a second portion 42h positioned between the first portion 41h and the second axis 62 in the positive side extending portion 42d, a second input current i2 flows based on the third amplified signal ARF3 and the fourth amplified signal ARF4 supplied from the third amplifier 31c and the fourth amplifier 31d respectively.

The difference between the phase of the first amplified signal ARF1 and the phase of the second amplified signal ARF2 is approximately 180° and similarly, the difference between the phase of the third amplified signal ARF3 and the phase of the fourth amplified signal ARF4 is approximately 180°. Further, the phase of the first amplified signal ARF1 and the phase of the third amplified signal ARF3 are substantially the same as each other. Thus, the current of the first amplified signal ARF1 and the current of the third amplified signal ARF3 flow side by side and the phases of these signals are the same as each other, whereby the direction of the second input current i2 and the direction of the first input current i1 are the same as each other.

Accordingly, the direction of the magnetic field that is generated by the first input current i1 in an inner side portion 41i of the first input side inductor 41 is opposite to the direction of the magnetic field that is generated by the second input current i2 in an inner side portion 42i of the second input side inductor 42. Here, the inner side portion 41i of the first input side inductor 41 is a region surrounded by the positive side extending portion 41d, the negative side extending portion 41e, and the coupling portion 41f, for example. In a similar manner, the inner side portion 42i of the second input side inductor 42 is a region surrounded by the positive side extending portion 42d, the negative side extending portion 42e, and the coupling portion 42f, for example.

Here, the direction of the magnetic field in the inner side portion 41i of the first input side inductor 41 is opposite to the direction of the magnetic field in an outer side portion of the first input side inductor 41. In a similar manner, the direction of the magnetic field in the inner side portion 42i of the second input side inductor 42 is opposite to the direction of the magnetic field in an outer side portion of the second input side inductor 42.

An outer side portion 41j of the first input side inductor 41 is, for example, an outside region of an outline that follows the outer circumference of the first input side inductor 41 and shapes a rectangle overall. That is, the inner side portion 42i of the second input side inductor 42 is included in the outer side portion 41j of the first input side inductor 41.

An outer side portion 42j of the second input side inductor 42 is, for example, an outside region of an outline that follows the outer circumference of the second input side inductor 42 and shapes a rectangle overall. That is, the inner side portion 41i of the first input side inductor 41 is included in the outer side portion 42j of the second input side inductor 42.

Accordingly, for example, when the first input current i1 generates a magnetic field directed to the z-axis positive side in the inner side portion 41i of the first input side inductor 41, a magnetic field directed to the z-axis negative side is generated in the outer side portion 41j of the first input side inductor 41. At this time, the second input current i2 generates a magnetic field directed to the z-axis negative side in the inner side portion 42i of the second input side inductor 42 and generates a magnetic field directed to the z-axis positive side in the outer side portion 42j of the second input side inductor 42.

On the other hand, for example, when the first input current i1 generates a magnetic field directed to the z-axis negative side in the inner side portion 41i of the first input side inductor 41, a magnetic field directed to the z-axis positive side is generated in the outer side portion 41j of the first input side inductor 41. At this time, the second input current i2 generates a magnetic field directed to the z-axis positive side in the inner side portion 42i of the second input side inductor 42 and generates a magnetic field directed to the z-axis negative side in the outer side portion 42j of the second input side inductor 42.

That is, the direction of the magnetic field generated by the first input current i1 in the inner side portion 41i of the first input side inductor 41 and the direction of the magnetic field generated by the second input current i2 in the outer side portion 42j of the second input side inductor 42 are the same as each other. Also, the direction of the magnetic field generated by the second input current i2 in the inner side portion 42i of the second input side inductor 42 and the direction of the magnetic field generated by the first input current i1 in the outer side portion 41j of the first input side inductor 41 are the same as each other.

That is, the magnetic field generated by the first input current i1 in the inner side portion 41i of the first input side inductor 41 is strengthened by a magnetic field existing in the inner side portion 41i of the first input side inductor 41 out of the magnetic field generated by the second input current i2 in the outer side portion 42j of the second input side inductor 42. Also, the magnetic field generated by the second input current i2 in the inner side portion 42i of the second input side inductor 42 is strengthened by a magnetic field existing in the inner side portion 42i of the second input side inductor 42 out of the magnetic field generated by the first input current i1 in the outer side portion 41j of the first input side inductor 41. Accordingly, a coupling coefficient in the current combining balun 101 can be increased, being able to suppress efficiency degradation in converting from a differential signal to a single phase signal.

The upper inductor set 50a (see FIG. 4) and the lower inductor set 50b (see FIG. 5) will be described.

The upper inductor set 50a includes a first output side inductor 51 (first output side conductive member), a second output side inductor 52 (second output side conductive member), a coupling portion 50aa, and a protruding portion 50ab. The lower inductor set 50b includes a third output side inductor 53 (third output side conductive member) and a fourth output side inductor 54 (fourth output side conductive member).

The first output side inductor 51 in the upper inductor set 50a is positioned on the z-axis positive side of the first input side inductor 41 and is wound around the first axis 61. More specifically, the first output side inductor 51 has a first end 51a and a second end 51b that is provided on a position overlapped with the first axis 61, in plan view of the upper inductor set 50a viewed from the z-axis positive side. The first output side inductor 51 winds clockwise by approximately 360° from the second end 51b to the first end 51a in a manner to separate from the first axis 61, in the plan view. This configuration can shorten the entire length of the first output side inductor 51.

The second output side inductor 52 is positioned on the z-axis positive side of the second input side inductor 42. The second output side inductor 52 has a shape that is substantially symmetrical to the first output side inductor 51 across the symmetry plane 63. That is, the second output side inductor 52 is positioned on the x-axis positive side of the first output side inductor 51 and is wound around the second axis 62 in an opposite direction to the winding direction of the first output side inductor 51.

More specifically, the second output side inductor 52 has a first end 52a and a second end 52b that is provided on a position overlapped with the second axis 62, in plan view of the upper inductor set 50a viewed from the z-axis positive side. The second output side inductor 52 winds counterclockwise by approximately 360° from the second end 52b to the first end 52a in a manner to separate from the second axis 62, in the plan view. This configuration can shorten the entire length of the second output side inductor 52.

The coupling portion 50aa has a shape that extends in substantially parallel to the x-axis direction and couples the first end 51a of the first output side inductor 51 and the first end 52a of the second output side inductor 52 to each other. The protruding portion 50ab has a shape that protrudes from an intermediate point between both end portions of the coupling portion 50aa toward the y-axis negative side.

The first output side inductor 51 has a third portion 51d that faces the first portion 41h of the first input side inductor 41. The third portion 51d is positioned between the first axis 61 and the second axis 62.

The second output side inductor 52 has a fourth portion 52e that faces the second portion 42h of the second input side inductor 42. The fourth portion 52e is positioned between the third portion 51d and the second axis 62.

A first output current i3 based on the first input current i1 flows through the third portion 51d. More specifically, in response to change of a magnetic field that is generated mainly by the first input current i1 flowing through the first input side inductor 41, an electric field is generated along a direction in which the first output side inductor 51 is wound, in the first output side inductor 51. The first output current i3 flows through the third portion 51d in accordance with the electric field thus generated.

A second output current i4 based on the second input current i2 flows through the fourth portion 52e in the same direction as the first output current i3. More specifically, in response to change of a magnetic field that is generated mainly by the second input current i2 flowing through the second input side inductor 42, an electric field is generated along a direction in which the second output side inductor 52 is wound, in the second output side inductor 52. The direction of the magnetic field generated by the first input current i1 is opposite to the direction of the magnetic field generated by the second input current i2 as described above and therefore, the second output current i4 having the same direction as the first output current i3 flows through the fourth portion 52e in accordance with the electric field in the second output side inductor 52.

The third output side inductor 53 and the fourth output side inductor 54 in the lower inductor set 50b are respectively wound in the opposite direction to the winding direction of the first output side inductor 51 and the winding direction of the second output side inductor 52 in the upper inductor set 50a.

More specifically, the third output side inductor 53 in the lower inductor set 50b is positioned on the z-axis negative side of the first input side inductor 41 and is wound around the first axis 61 in the opposite direction to the winding direction of the first output side inductor 51. More specifically, the third output side inductor 53 has a first end 53a that is grounded and a second end 53b that is provided on a position overlapped with the first axis 61 in plan view of the lower inductor set 50b viewed from the z-axis positive side. The third output side inductor 53 winds counterclockwise by approximately 360° from the second end 53b to the first end 53a in a manner to separate from the first axis 61, in the plan view. The second end 53b is connected with the second end 51b of the first output side inductor 51 through a via 56a (see FIG. 2). The via 56a is formed along the first axis 61 and penetrates through the inner side portion 41i of the first input side inductor 41.

The fourth output side inductor 54 is positioned on the z-axis negative side of the second input side inductor 42. The fourth output side inductor 54 has a shape that is substantially symmetrical to the third output side inductor 53 across the symmetry plane 63. That is, the fourth output side inductor 54 is positioned on the x-axis positive side of the third output side inductor 53 and is wound around the second axis 62 in an opposite direction to the winding direction of the third output side inductor 53. In other words, the fourth output side inductor 54 is wound around the second axis 62 in the opposite direction to the winding direction of the second output side inductor 52.

More specifically, the fourth output side inductor 54 has a first end 54a that is grounded and a second end 54b that is provided on a position overlapped with the second axis 62 in plan view of the lower inductor set 50b viewed from the z-axis positive side. The fourth output side inductor 54 winds clockwise by approximately 360° from the second end 54b to the first end 54a in a manner to separate from the second axis 62, in the plan view. The second end 54b is connected with the second end 52b of the second output side inductor 52 through a via 56b (see FIG. 2). The via 56b is formed along the second axis 62 and penetrates through the inner side portion 42i of the second input side inductor 42.

The third output side inductor 53 has a fifth portion 53d that is opposed to the third portion 51d of the first output side inductor 51 with the first portion 41h of the first input side inductor 41 interposed therebetween. The fifth portion 53d is positioned between the first axis 61 and the second axis 62.

The fourth output side inductor 54 has a sixth portion 54e that is opposed to the fourth portion 52e of the second output side inductor 52 with the second portion 42h of the second input side inductor 42 interposed therebetween. The sixth portion 54e is positioned between the fifth portion 53d and the second axis 62.

A third output current i5 based on the first input current i1 flows through the fifth portion 53d, similarly to the first output current i3 flowing through the third portion 51d in the first output side inductor 51. The direction of the third output current i5 and the direction of the first output current i3 are the same as each other. A fourth output current i6 based on the second input current i2 flows through the sixth portion 54e in the same direction as the third output current i5, similarly to the second output current i4 flowing through the fourth portion 52e in the second output side inductor 52.

An end portion on the y-axis negative side of the protruding portion 50ab in the upper inductor set 50a is a first output terminal 55a that outputs a combined output current i7. The combined output current i7 is obtained by combining a current induced by the first output side inductor 51 and the third output side inductor 53 and a current induced by the second output side inductor 52 and the fourth output side inductor 54 with each other. The first output terminal 55a is connected with the output terminal 22 via a connection conductive member 57a.

Thus, the first output side inductor 51 and the third output side inductor 53 are connected in series and therefore, the first output side inductor 51 and the third output side inductor 53 function as the output side inductor (see FIG. 1).

In a similar manner, the second output side inductor 52 and the fourth output side inductor 54 are connected in series and therefore, the second output side inductor 52 and the fourth output side inductor 54 function as the output side inductor 82 (see FIG. 1). Further, the output signal RFout having the combined output current i7 is outputted from the output terminal 22.

[Simulation]

A simulation of the current combining balun 101 will be described.

Figure 6:
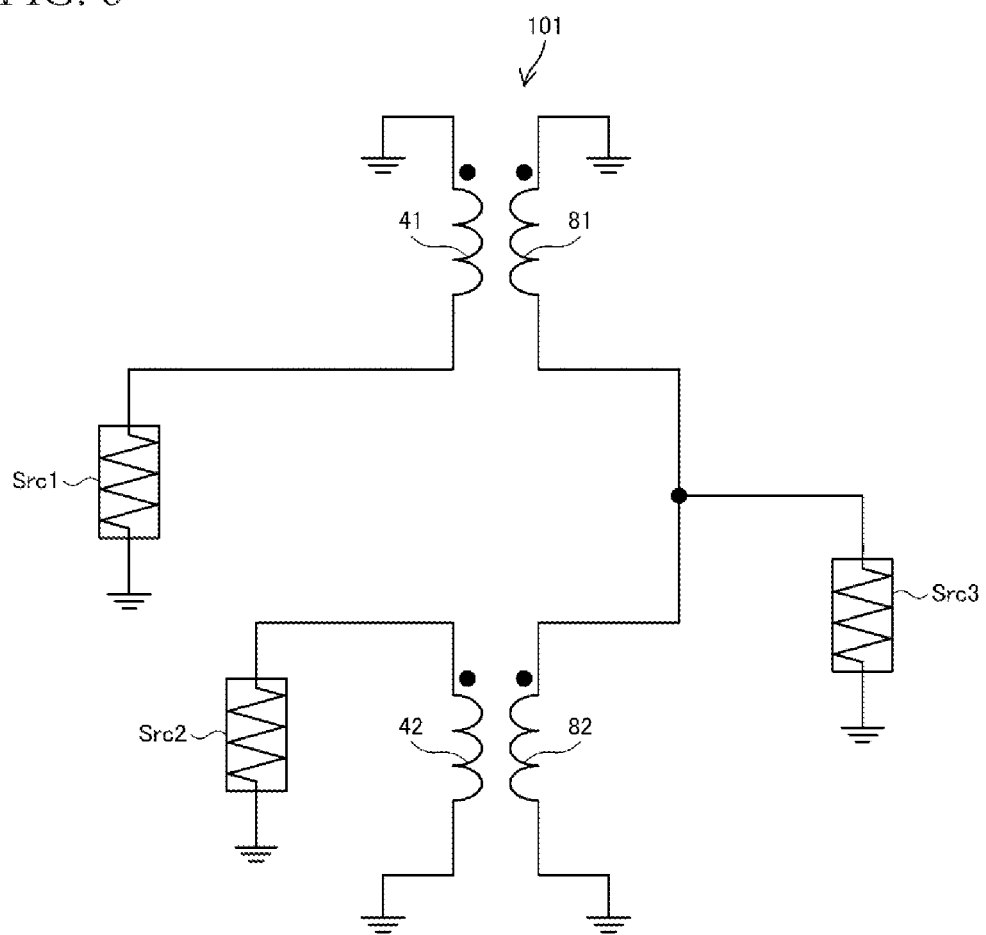
FIG. 6 is a circuit diagram used in a simulation of the current combining balun 101.

FIG. 6 is a circuit diagram used in the simulation of the current combining balun 101. As illustrated in FIG. 6, a signal source Src1 supplies a signal to the other end of the first input side inductor 41 whose one end is grounded. The signal supplied to the other end of the first input side inductor 41 is obtained by combining the first amplified signal ARF1 and the second amplified signal ARF2 that are outputted from the first amplifier 31a and the second amplifier 31b respectively.

A signal source Src2 supplies a signal to the other end of the second input side inductor 42 whose one end is grounded. The signal supplied to the other end of the second input side inductor 42 is obtained by combining the third amplified signal ARF3 and the fourth amplified signal ARF4 that are outputted from the third amplifier 31c and the fourth amplifier 31d respectively.

A signal source Src3 is capable of supplying a signal to the other end of the output side inductor 81 whose one end is grounded and to the other end of the output side inductor 82 whose one end is grounded.

Figure 7:
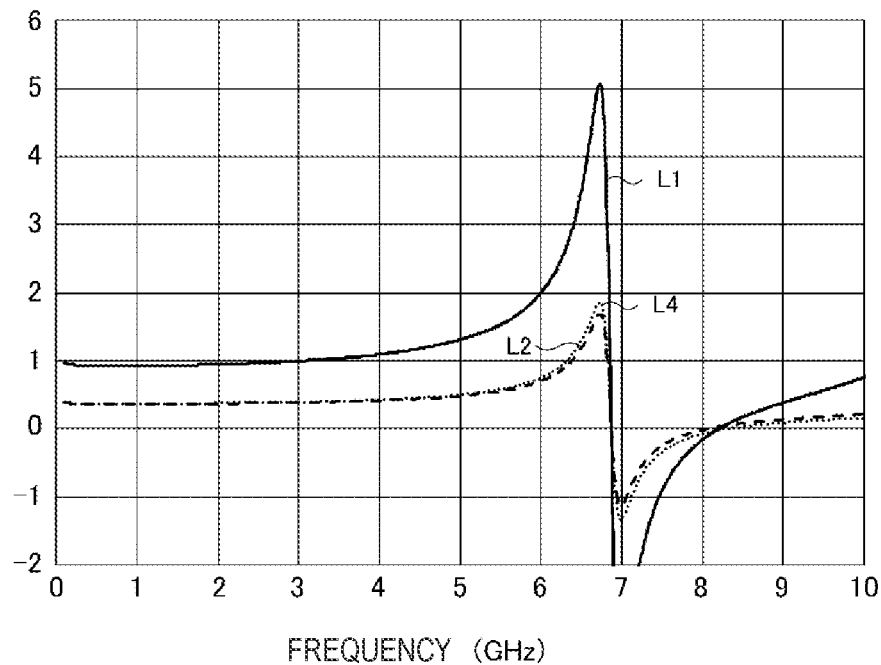
FIG. 7 illustrates an example of frequency change of an inductor relative to each signal source.

FIG. 7 illustrates an example of frequency change of an inductor relative to each signal source. In FIG. 7, the horizontal axis represents a frequency whose unit is "GHz" and the vertical axis represents inductance whose unit is "nH".

As illustrated in FIG. 7, a curve L1 represents, for example, frequency change of inductance from the signal source Src3 to the ground. Curves L2 and L4 represent, for example, frequency change of inductance from the signal source Src1 and the signal source Src2 to the ground respectively.

For example, at 5 GHz, the curves L1, L2, and L4 respectively show 1.30 nH, 0.48 nH, and 0.50 nH. Further, the curves L1, L2, and L4 show inductance at which frequency change is small but larger than zero in a frequency region of 6 GHz or lower, for example. That is, the first input side inductor 41, the second input side inductor 42, the output side inductor 81, and the output side inductor 82 function as inductors in the frequency region of 6 GHz or lower, being able to make the balun favorably function in this frequency region.

Figure 8:
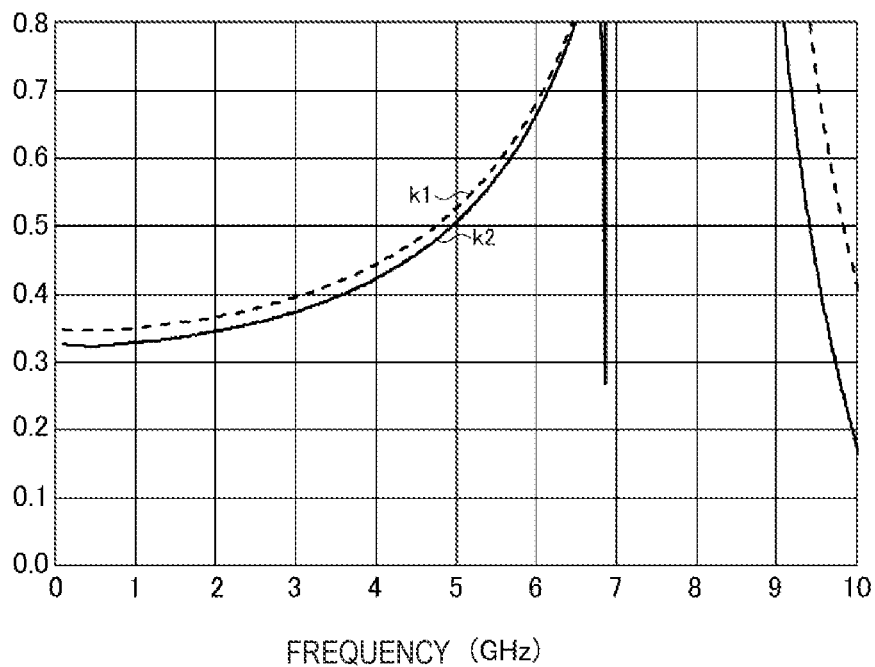
FIG. 8 illustrates an example of frequency change of a coupling coefficient of each transformer in the current combining balun 101.

FIG. 8 illustrates an example of frequency change of a coupling coefficient of each transformer in the current combining balun 101. In FIG. 8, the horizontal axis represents a frequency whose unit is "GHz" and the vertical axis represents a coupling coefficient.

As illustrated in FIG. 8, a curve k1 represents frequency change of a coupling coefficient between the first input side inductor 41 and the first and third output side inductors 51 and 53, for example. A curve k2 represents frequency change of a coupling coefficient between the second input side inductor 42 and the second and fourth output side inductors 52 and 54, for example.

A coupling coefficient is a coefficient whose maximum value is 1. As the value of the coupling coefficient increases, conversion efficiency rises. In the present embodiment, the curves k1 and k2 respectively show 0.53 and 0.51 at 5 GHz, for example, and thus, the balun is capable of converting a differential signal into a single end signal at a favorable conversion efficiency.

Second Embodiment

A differential amplification device according to a second embodiment will be described. The second and following embodiments will omit the description of matters common to those of the first embodiment and describe only different points. In particular, the same advantageous effects obtained from the same configuration will not be sequentially mentioned in each embodiment.

Figure 9:
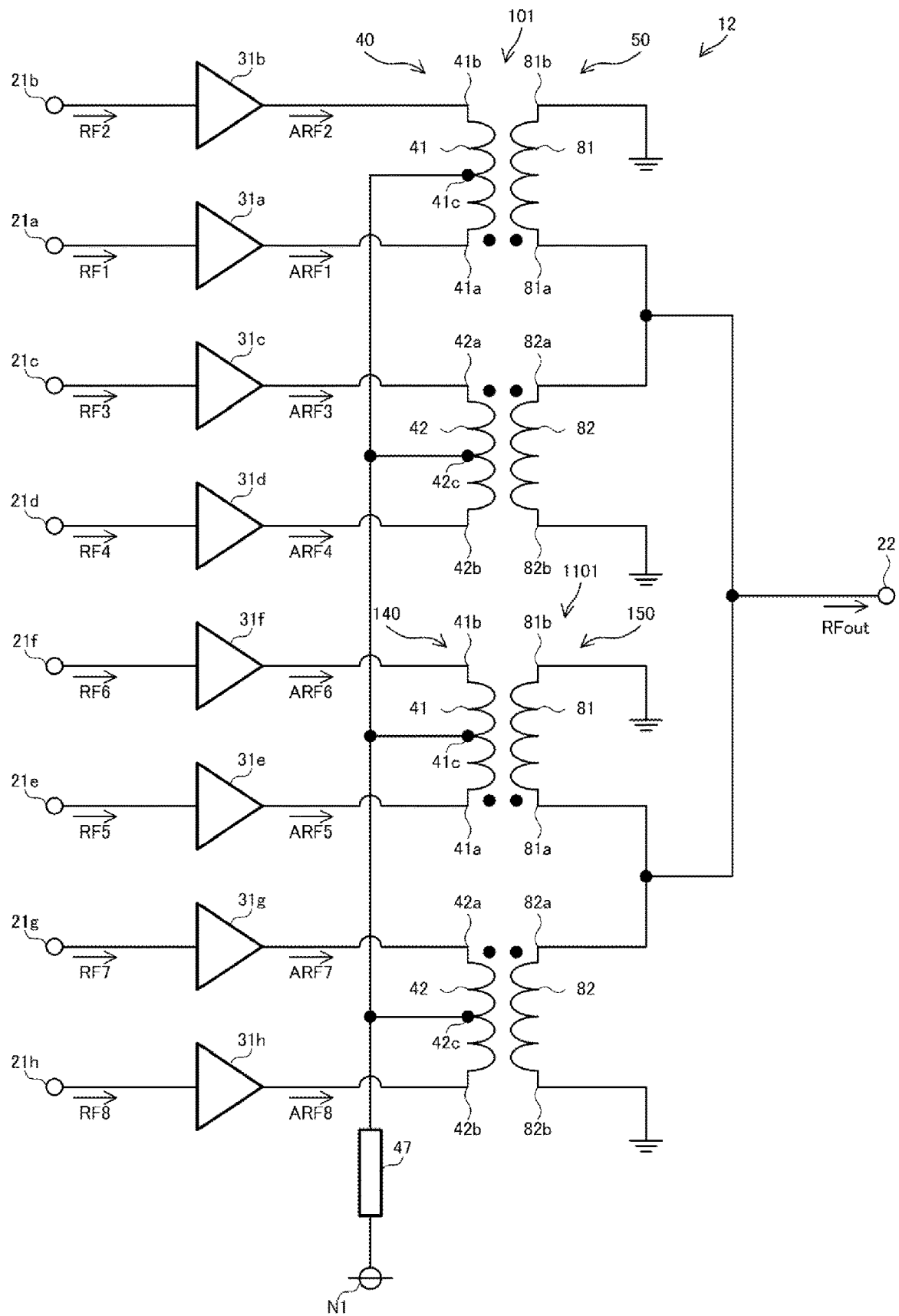
FIG. 9 is a circuit diagram of a differential amplification circuit 12.

FIG. 9 is a circuit diagram of a differential amplification circuit 12. As illustrated in FIG. 9, the differential amplification circuit 12 according to the second embodiment is different from the differential amplification circuit 11 according to the first embodiment in that four differential signals are inputted into the differential amplification circuit 12.

The differential amplification circuit 12 is a circuit provided to a differential amplification device and further includes a fifth amplifier 31e, a sixth amplifier 31f, a seventh amplifier 31g, an eighth amplifier 31h, and a current combining balun 1101, compared to the differential amplification circuit 11 illustrated in FIG. 1. The current combining balun 1101 includes an input unit 140 and an output unit 150. The input unit 140 includes the first input side inductor 41 and the second input side inductor 42. The output unit 150 includes the output side inductor 81 and the output side inductor 82.

The differential amplification circuit 12 amplifies each of first to fourth differential signals and converts the first to fourth differential signals, which are subjected to the amplification, into four respective single end signals. Then, the differential amplification circuit 12 outputs an output signal RFout that is obtained by combining these single end signals from the output terminal 22.

More specifically, the third differential signal is composed of a fifth signal RF5 that has substantially the same phase as that of the first signal RF1 and a sixth signal RF6 that has substantially the same phase as that of the second signal RF2. In a similar manner, the fourth differential signal is composed of a seventh signal RF7 that has substantially the same phase as that of the first signal RF1 and an eighth signal RF8 that has substantially the same phase as that of the second signal RF2.

As the phase of the first signal RF1 and the phase of the second signal RF2 are different from each other by approximately 180° as described above, the difference between the phase of the fifth signal RF5 and the phase of the sixth signal RF6 is approximately 180° and the difference between the phase of the seventh signal RF7 and the phase of the eighth signal RF8 is approximately 180°. The third differential signal and the fourth differential signal are generated by, for example, a balun that is provided on the previous stage of the differential amplification circuit 12.

The fifth amplifier 31e, the sixth amplifier 31f, the seventh amplifier 31g, and the eighth amplifier 31h are similar amplifiers to the first amplifier 31a, the second amplifier 31b, the third amplifier 31c, and the fourth amplifier 31d.

The fifth amplifier 31e amplifies the fifth signal RF5 supplied via an input terminal 21e and outputs a fifth amplified signal ARF5 from an output terminal thereof. The sixth amplifier 31f amplifies the sixth signal RF6 supplied via an input terminal 21f and outputs a sixth amplified signal ARF6 from an output terminal thereof. The seventh amplifier 31g amplifies the seventh signal RF7 supplied via an input terminal 21g and outputs a seventh amplified signal ARF7 from an output terminal thereof. The eighth amplifier 31h amplifies the eighth signal RF8 supplied via an input terminal 21h and outputs an eighth amplified signal ARF8 from an output terminal thereof.

The current combining balun 1101 is a similar balun to the current combining balun 101 and converts the third differential signal and the fourth differential signal into two respective single end signals. In the current combining balun 1101, the first input side inductor 41 in the input unit 140 has the first end 41a, the second end 41b, and the intermediate tap 41c. The first end 41a is connected with the output terminal of the fifth amplifier 31e. The second end 41b is connected with the output terminal of the sixth amplifier 31f. The intermediate tap 41c is connected with the power source voltage supply node N1 via the inductor 47. The fifth amplifier 31e and the sixth amplifier 31f perform an amplification operation by using a voltage received from the power source voltage supply node N1 via the inductor 47 and the intermediate tap 41c.

The output side inductor 81 in the output unit 150 is electromagnetically coupled mainly with the first input side inductor 41 in the input unit 140 and generates an output current based on an electromagnetic field that is generated by the fifth amplified signal ARF5 and the sixth amplified signal ARF6 which are supplied to the first input side inductor 41. The output current will be described in detail later. The output side inductor 81 has the first end 81a, which is connected with the output terminal 22, and the second end 81b which is grounded.

The second input side inductor 42 in the input unit 140 has the first end 42a, the second end 42b, and the intermediate tap 42c. The first end 42a is connected with the output terminal of the seventh amplifier 31g. The second end 42b is connected with the output terminal of the eighth amplifier 31h. The intermediate tap 42c is connected with the power source voltage supply node N1 via the inductor 47. The seventh amplifier 31g and the eighth amplifier 31h perform an amplification operation by using a voltage received from the power source voltage supply node N1 via the inductor 47 and the intermediate tap 42c.

The output side inductor 82 in the output unit 150 is electromagnetically coupled mainly with the second input side inductor 42 in the input unit 140 and generates an output current based on an electromagnetic field that is generated by the seventh amplified signal ARF7 and the eighth amplified signal ARF8 which are supplied to the second input side inductor 42. The output current will be described in detail later. The output side inductor 82 has the first end 82a, which is connected with the output terminal 22, and the second end 82b which is grounded.

[Layout]

A layout of the differential amplification circuit 12 will be described.

Figure 10:
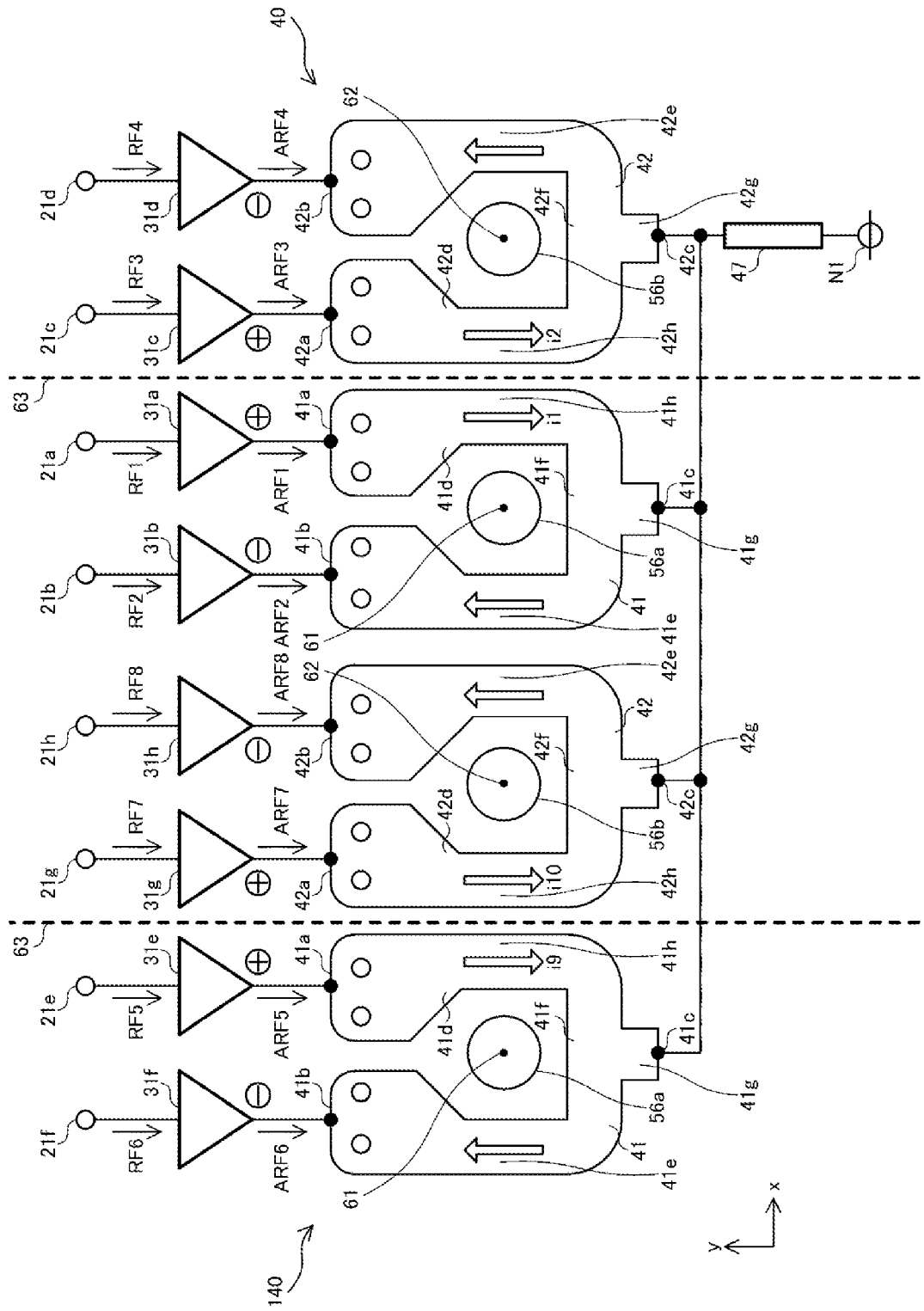
FIG. 10 illustrates an example of a layout of the input unit 40 and an input unit 140.
Figure 11:
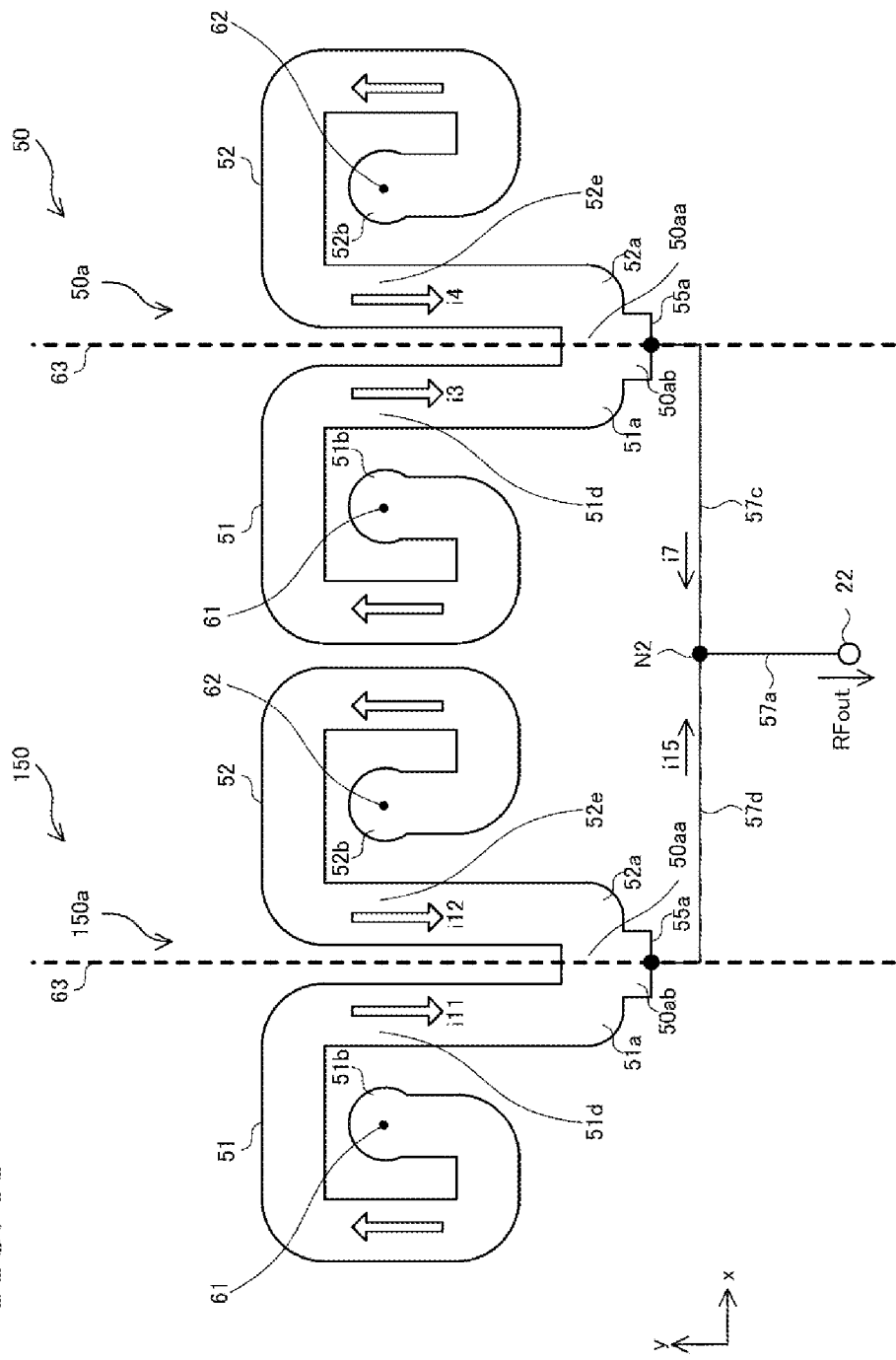
Figure 12:
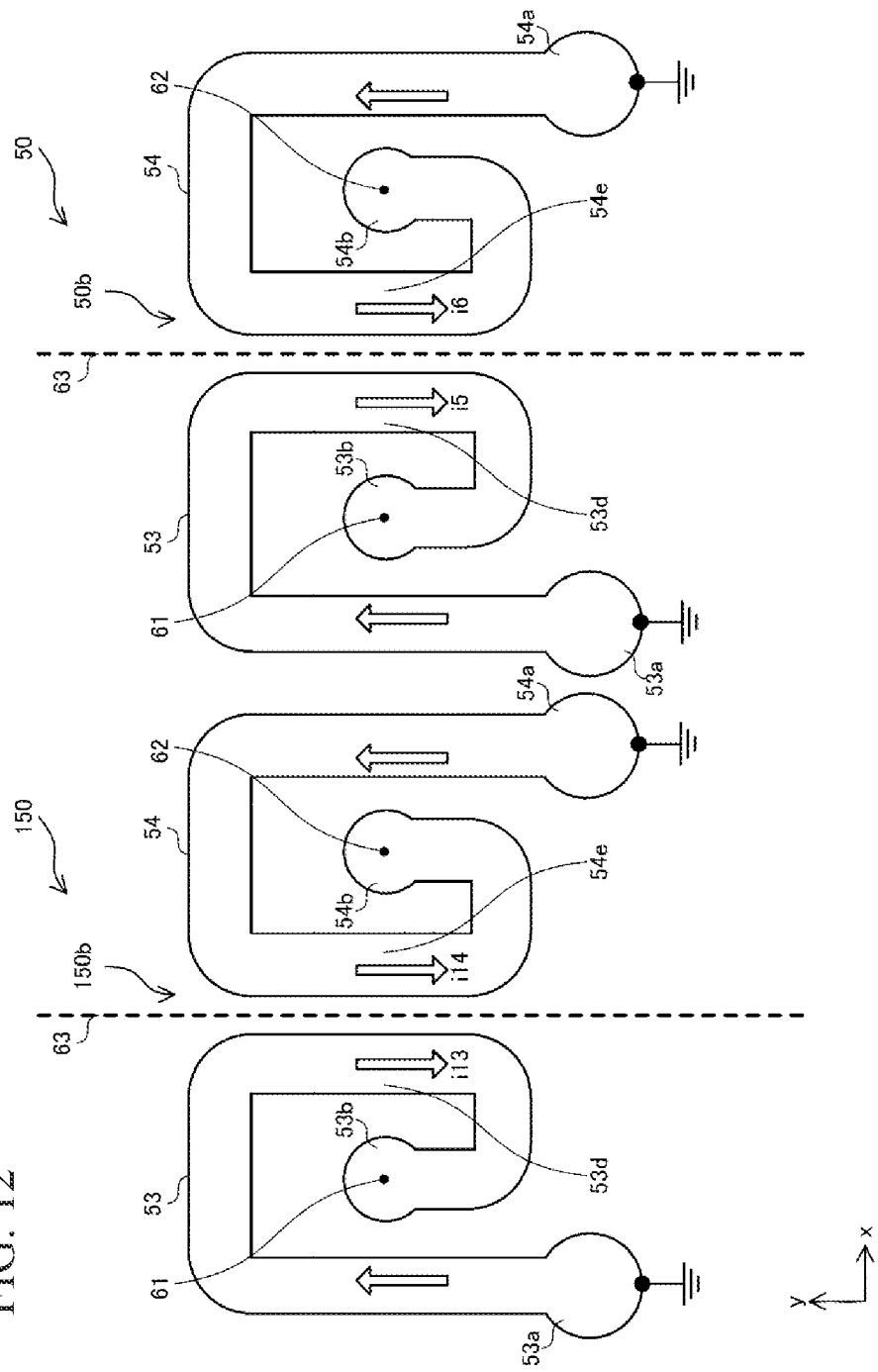
FIG. 12 illustrates an example of a layout of the lower inductor set 50b and a lower inductor set 150b.

FIG. 10 illustrates an example of a layout of the input unit 40 and the input unit 140. FIG. 11 illustrates an example of a layout of the upper inductor set 50a and an upper inductor set 150a. FIG. 12 illustrates an example of a layout of the lower inductor set 50b and a lower inductor set 150b. The way of reading FIGS. 10 to 12 is the same as that of FIGS. 3 to 5.

As illustrated in FIGS. 10 and 12, the input unit 140 is provided on the x-axis negative side of the input unit 40 (see FIG. 10). The first amplifier 31a, the second amplifier 31b, the third amplifier 31c, the fourth amplifier 31d, the fifth amplifier 31e, the sixth amplifier 31f, the seventh amplifier 31g, and the eighth amplifier 31h are provided on, for example, the second layer in an order of the sixth amplifier 31f, the fifth amplifier 31e, the seventh amplifier 31g, the eighth amplifier 31h, the second amplifier 31b, the first amplifier 31a, the third amplifier 31c, and the fourth amplifier 31d toward the x-axis positive side.

In the positive side extending portion 41d of the first input side inductor 41 in the input unit 140, more specifically, in the first portion 41h, a third input current i9 flows based on the fifth amplified signal ARF5 and the sixth amplified signal ARF6 supplied from the fifth amplifier 31e and the sixth amplifier 31f respectively.

In the positive side extending portion 42d of the second input side inductor 42 in the input unit 140, more specifically, in the second portion 42h, a fourth input current i10 flows based on the seventh amplified signal ARF7 and the eighth amplified signal ARF8 supplied from the seventh amplifier 31g and the eighth amplifier 31h respectively.

The phase of the first amplified signal ARF1 and the phase of the second amplified signal ARF2 are different from each other by approximately 180°. Further, the fifth amplified signal ARF5 and the sixth amplified signal ARF6 have substantially the same phases as those of the first amplified signal ARF1 and the second amplified signal ARF2 respectively. Therefore, the direction of the third input current i9 and the direction of the first input current i1 are the same as each other. In a similar manner, the seventh amplified signal ARF7 and the eighth amplified signal ARF8 have substantially the same phases as those of the first amplified signal ARF1 and the second amplified signal ARF2 respectively. Therefore, the direction of the fourth input current i10 and the direction of the first input current i1 are the same as each other.

The output unit 150 includes the upper inductor set 150a similar to the upper inductor set 50a and the lower inductor set 150b similar to the lower inductor set 50b and is provided on the x-axis negative side of the output unit 50 (see FIGS. 11 and 12). More specifically, the upper inductor set 150a in the output unit 150 is provided on the x-axis negative side of the upper inductor set 50a and above the input unit 140 (see FIGS. 10 and 11). The lower inductor set 150b is provided on the x-axis negative side of the lower inductor set 50b and below the input unit 140 (see FIGS. 10 and 12).

A fifth output current i11 based on the third input current i9 flows through the third portion 51d (see FIG. 11) in the upper inductor set 150a. The direction of the fifth output current i11 and the direction of the first output current i3 are the same as each other (see FIG. 11). A sixth output current i12 based on the fourth input current i10 flows through the fourth portion 52e in the same direction as the fifth output current i11, that is, in the same direction as the first output current i3.

A seventh output current i13 based on the third input current i9 flows through the fifth portion 53d (see FIG. 12) in the lower inductor set 150b. The direction of the seventh output current i13 and the direction of the first output current i3 are the same as each other. An eighth output current i14 based on the fourth input current i10 flows through the sixth portion 54e in the same direction as the seventh output current i13, that is, in the same direction as the first output current i3.

The first output terminal 55a in the upper inductor set 150a is connected with the output terminal 22 via a connection conductive member 57d, a node N2, and the connection conductive member 57a. The first output terminal 55a in the upper inductor set 150a outputs a combined output current i15. The combined output current i15 is obtained by combining a current induced by the first output side inductor 51 in the upper inductor set 150a and the third output side inductor 53 in the lower inductor set 150b and a current induced by the second output side inductor 52 in the upper inductor set 150a and the fourth output side inductor 54 in the lower inductor set 150b with each other.

The first output terminal 55a in the upper inductor set 50a is connected with the output terminal 22 via a connection conductive member 57c, the node N2, and the connection conductive member 57a and outputs a combined output current i7.

Then, the output signal RFout having a combined output current, which is obtained by combining the combined output current i7 and the combined output current i15 with each other, is outputted from the output terminal 22.

Third Embodiment

A differential amplification device according to a third embodiment will be described.

Figure 13:
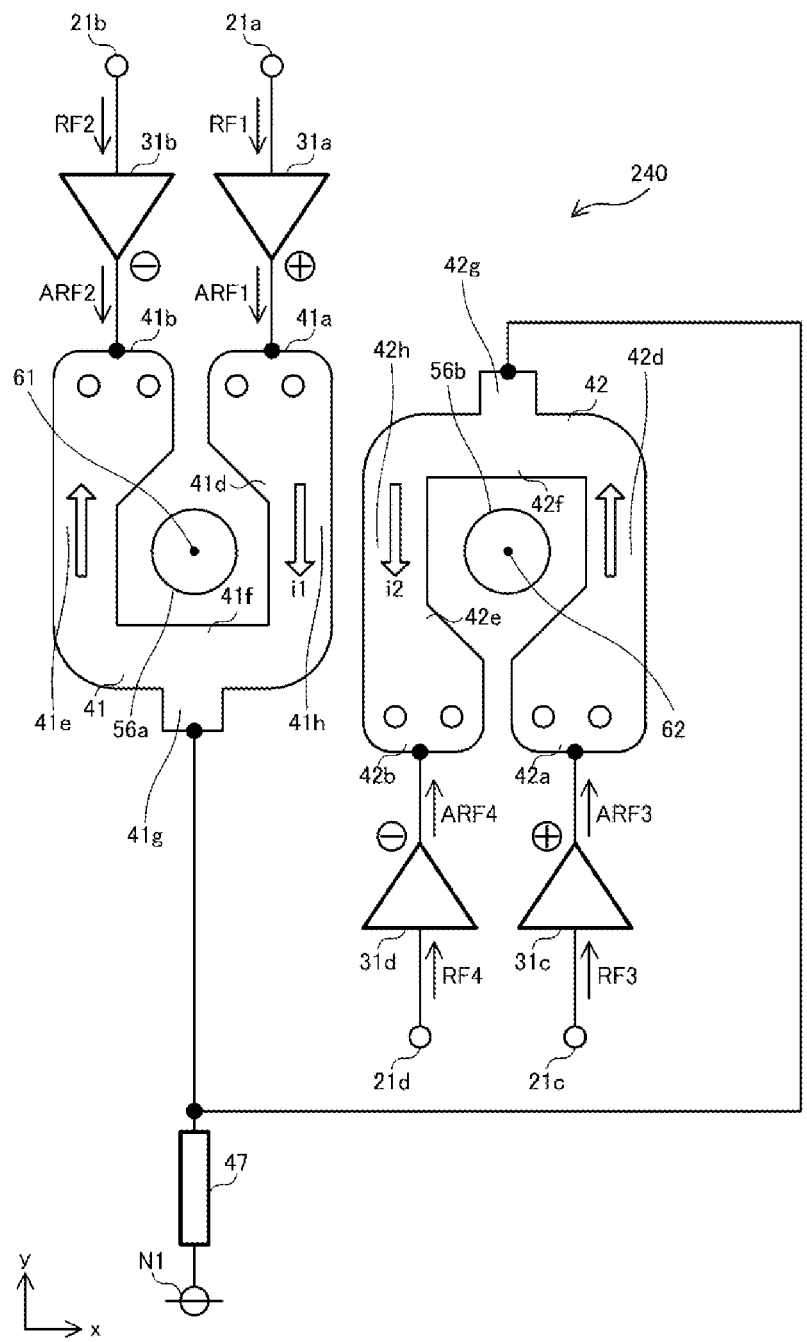
FIG. 13 illustrates an example of a layout of an input unit 240 in the current combining balun 101.

FIG. 13 illustrates an example of a layout of an input unit 240 in the current combining balun 101. The way of reading FIG. 13 is the same as that of FIG. 3. As illustrated in FIG. 13, the input unit 240 according to the third embodiment is different from the input unit 40 according to the first embodiment in that two U-shaped inductors are opened in mutually-opposite directions.

The current combining balun 101 according to the present embodiment includes the input unit 240 instead of the input unit 40, compared to the current combining balun 101 illustrated in FIG. 3.

In the present embodiment, the first input side inductor 41 has the U shape that is opened in the second direction. The second input side inductor 42 is positioned on the x-axis positive side of the first input side inductor 41 and has the U shape that is opened in a third direction which is opposite to the second direction.

The first amplifier 31a and the second amplifier 31b are provided on the y-axis positive side of the first input side inductor 41 in an order of the second amplifier 31b and the first amplifier 31a toward the x-axis positive side (see FIG. 13). The third amplifier 31c and the fourth amplifier 31d are provided on the y-axis negative side of the second input side inductor 42 in an order of the fourth amplifier 31d and the third amplifier 31c toward the x-axis positive side.

The negative side extending portion 42e of the second input side inductor 42 is positioned on the y-axis positive side of the fourth amplifier 31d and between the positive side extending portion 41d of the first input side inductor 41 and the second axis 62. The negative side extending portion 42e has a shape that extends from the second end 42b, connected with the output terminal of the fourth amplifier 31d, toward the y-axis positive side.

The positive side extending portion 42d is positioned on the y-axis positive side of the third amplifier 31c and on an opposite side of the negative side extending portion 42e about the second axis 62 used as a reference. The positive side extending portion 42d has a shape that extends from the first end 42a, connected with the output terminal of the third amplifier 31c, toward the y-axis positive side.

The second input side inductor 42 has the U shape that is opened in the third direction which is directed from the y-axis positive side toward the y-axis negative side, as a whole. In the negative side extending portion 42e of the second input side inductor 42, more specifically, in the second portion 42h, which is positioned between the first portion 41h and the second axis 62, in the negative side extending portion 42e, the second input current i2 flows based on the third amplified signal ARF3 and the fourth amplified signal ARF4 supplied from the third amplifier 31c and the fourth amplifier 31d respectively.

The phase of the first amplified signal ARF1 and the phase of the second amplified signal ARF2 are different from each other by approximately 180°. Further, the third amplified signal ARF3 and the fourth amplified signal ARF4 have substantially the same phases as those of the first amplified signal ARF1 and the second amplified signal ARF2 respectively. Therefore, the direction of the second input current i2 and the direction of the first input current i1 are the same as each other.

REFERENCE EXAMPLE

A differential amplification device according to a reference example will be described.

Figure 14:
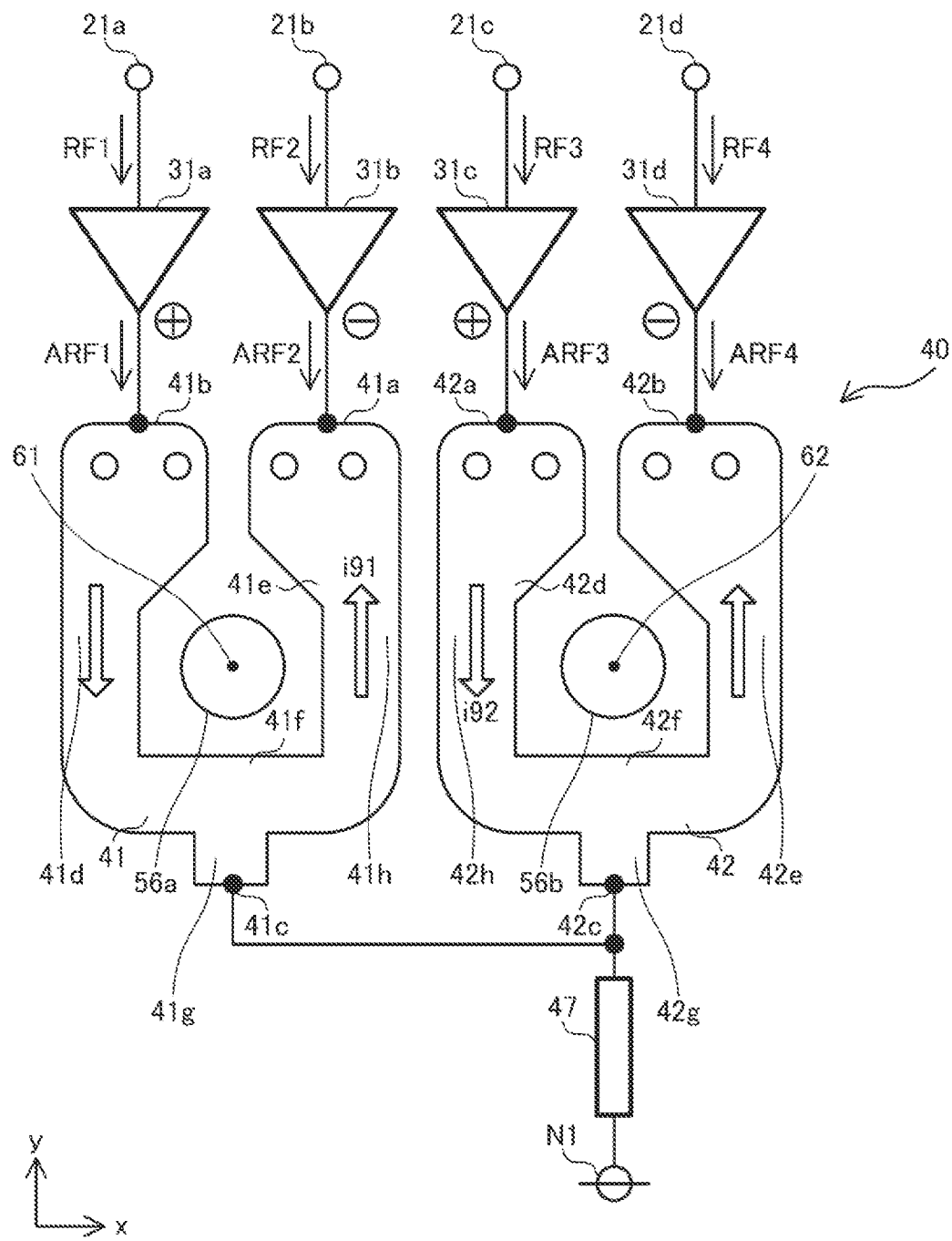
FIG. 14 illustrates an example of a layout of a differential amplification device according to a reference example.
Figure 15:
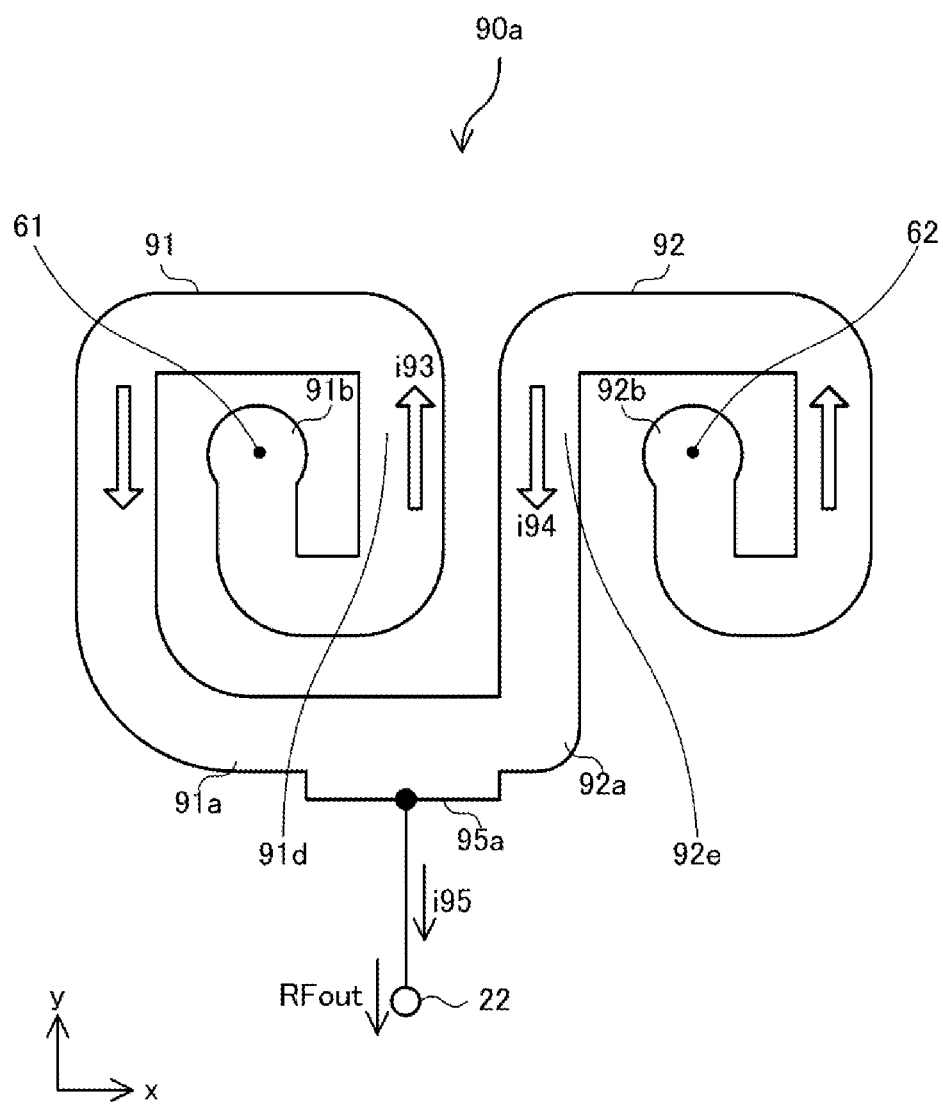
FIG. 15 illustrates an example of a layout of an upper inductor set 90a in a current combining balun according to the reference example.

FIG. 14 illustrates an example of a layout of the input unit 40 in a current combining balun according to the reference example. FIG. 15 illustrates an example of a layout of an upper inductor set 90a in the current combining balun according to the reference example. The way of reading FIGS. 14 and 15 is the same as that of FIGS. 3 and 4.

As illustrated in FIGS. 14 and 15, in the differential amplification device according to the reference example, the first amplifier 31a, the second amplifier 31b, the third amplifier 31c, and the fourth amplifier 31d are provided, for example, on the second layer in an order of the first amplifier 31a, the second amplifier 31b, the third amplifier 31c, and the fourth amplifier 31d toward the x-axis positive side (see FIG. 14).

The first end 41a and the second end 41b of the first input side inductor 41 are connected with the output terminal of the second amplifier 31b and the output terminal of the first amplifier 31a respectively. The first end 42a and the second end 42b of the second input side inductor 42 are connected with the output terminal of the third amplifier 31c and the output terminal of the fourth amplifier 31d respectively.

Accordingly, the direction of an input current i91 that flows through the first portion 41h of the first input side inductor 41 is opposite to the direction of an input current i92 that flows through the second portion 42h of the second input side inductor 42.

Accordingly, the direction of a magnetic field that is generated by the input current i91 in an inner side portion of the first input side inductor 41 is the same as the direction of a magnetic field that is generated by the input current i92 in an inner side portion of the second input side inductor 42.

That is, the direction of the magnetic field generated by the input current i91 in the inner side portion of the first input side inductor 41 and the direction of a magnetic field generated by the input current i92 in an outer side portion of the second input side inductor 42 are opposite to each other. Also, the direction of the magnetic field generated by the input current i92 in the inner side portion of the second input side inductor 42 and the direction of a magnetic field generated by the input current i91 in an outer side portion of the first input side inductor 41 are opposite to each other.

That is, the magnetic field generated by the input current i91 in the inner side portion of the first input side inductor 41 is weakened by the magnetic field generated by the input current i92 in the outer side portion of the second input side inductor 42. Also, the magnetic field generated by the input current i92 in the inner side portion of the second input side inductor 42 is weakened by the magnetic field generated by the input current i91 in the outer side portion of the first input side inductor 41.

The upper inductor set 90a will now be described. The upper inductor set 90a is provided on the first layer. A first output side inductor 91 and a second output side inductor 92 in the upper inductor set 90a are positioned above the first input side inductor 41 and the second input side inductor 42 respectively. The first output side inductor 91 and the second output side inductor 92 are wound in the same direction as each other.

More specifically, the first output side inductor 91 has a first end 91a, which is connected with a first output terminal 95a, and a second end 91b, which is provided on a position overlapped with the first axis 61 and is grounded. The second output side inductor 92 has a first end 92a, which is connected with the first output terminal 95a, and a second end 92b, which is provided on a position overlapped with the second axis 62 and is grounded.

The first output side inductor 91 and the second output side inductor 92 wind counterclockwise in plan view of the upper inductor set 90a viewed from the z-axis positive side.

In the first output side inductor 91, an output current i93 based on the input current i91 flows through a third portion 91d facing the first portion 41h of the first input side inductor 41.

In the second output side inductor 92, an output current i94 based on the input current i92 flows through a fourth portion 92e facing the second portion 42h of the second input side inductor 42, in the opposite direction to the output current i93. The first output terminal 95a outputs a combined output current i95, which is obtained by combining the output current i93 and the output current i94, to the output terminal 22.

Not illustrated, a lower inductor set similar to the upper inductor set 90a is provided on the third layer and a combined output current similar to the combined output current i95 is outputted to the output terminal 22. The output signal RFout is outputted from the output terminal 22. The output signal RFout has a current that is obtained by combining the combined output current i95 and the combined output current from the lower inductor set with each other.

[Simulation]

A simulation of the current combining balun according to the reference example will be described. This simulation was performed by using the circuit illustrated in FIG. 6.

Figure 16:
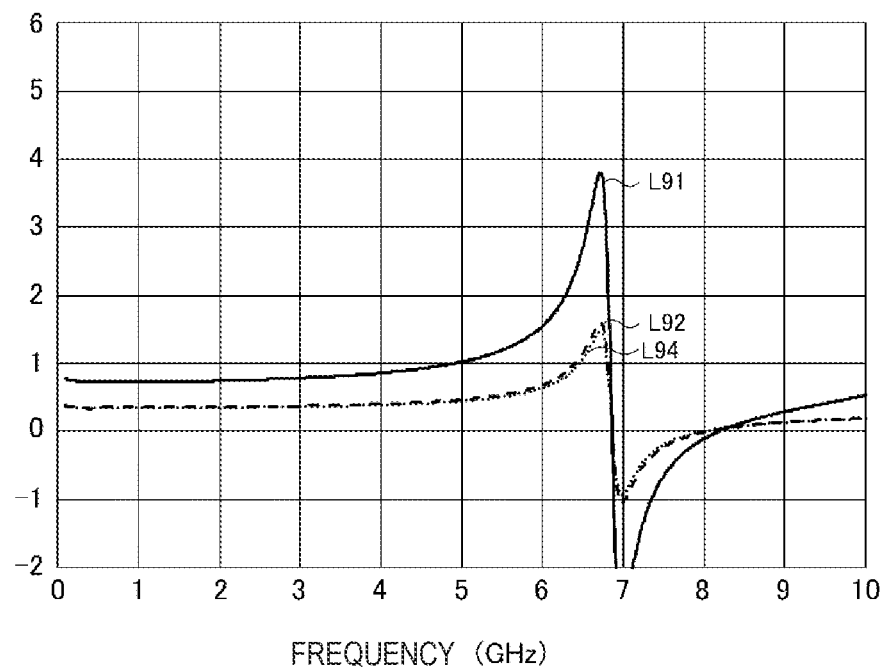
FIG. 16 illustrates an example of frequency change of an inductor according to the reference example relative to each signal source.

FIG. 16 illustrates an example of frequency change of the inductor according to the reference example relative to each signal source. The way of reading FIG. 16 is the same as that of FIG. 7. As illustrated in FIGS. 6 and 16, a curve L91 represents, for example, frequency change of inductance from the signal source Src3 to the ground. Curves L92 and L94 represent, for example, frequency change of inductance from the signal source Src1 and the signal source Src2 to the ground respectively.

For example, at 5 GHz, the curves L91, L92, and L94 respectively show 1.02 nH, 0.46 nH, and 0.44 nH. As the curves L1, L2, and L4 respectively show 1.30 nH, 0.48 nH, and 0.50 nH at 5 GHz (see FIG. 7) as described above, inductance of each inductor constituting the current combining balun 101 can be raised in the current combining balun 101 compared to the current combining balun according to the reference example.

Figure 17:
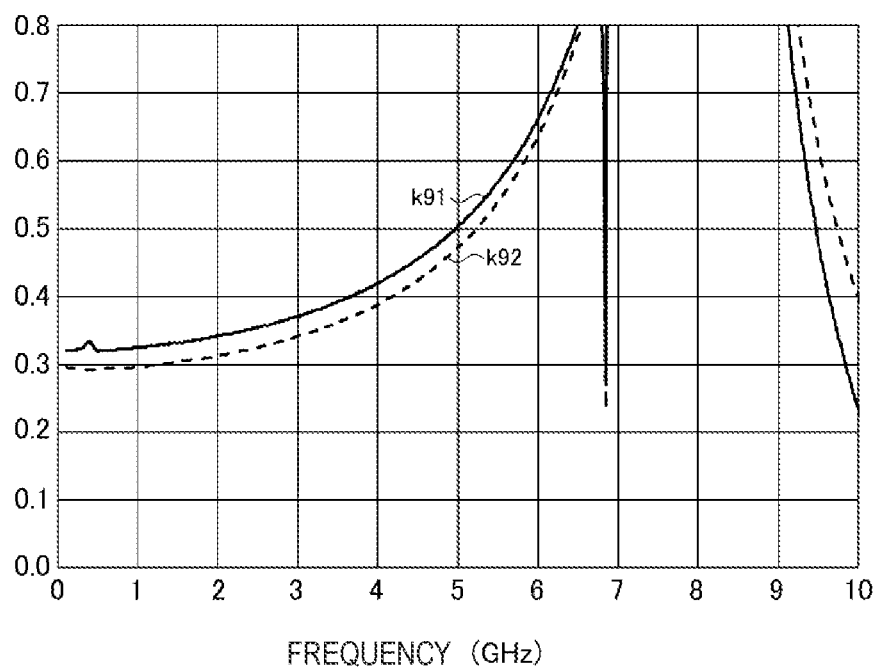
FIG. 17 illustrates an example of frequency change of a coupling coefficient of each transformer in the current combining balun according to the reference example.

FIG. 17 illustrates an example of frequency change of a coupling coefficient of each transformer in the current combining balun according to the reference example. The way of reading FIG. 17 is the same as that of FIG. 8.

As illustrated in FIG. 17, a curve k91 represents frequency change of a coupling coefficient between the first input side inductor 41 and the first output side inductors 91 on the first and third layers, for example. A curve k92 represents frequency change of a coupling coefficient between the second input side inductor 42 and the second output side inductors 92 on the first and third layers, for example.

For example, at 5 GHz, the curves k91 and k92 respectively show 0.50 and 0.47. As described above, the curves k1 and k4 respectively show 0.53 and 0.51 at 5 GHz (see FIG. 8) and thus, the current combining balun 101 is capable of converting a differential signal into a single end signal at more favorable conversion efficiency, compared to the current combining balun according to the reference example.

In the above description, the current combining balun 101 has the configuration in which the upper inductor set 50a and the lower inductor set 50b are provided on the first layer and the third layer respectively. However, the configuration is not limited to this. The current combining balun 101 may be configured to include either one of the upper inductor set 50a on the first layer and the lower inductor set 50b on the third layer.

The description has been provided on the configuration in which each of the first surface 66, the second surface 67, and the third surface 68 intersects with the first axis 61 and the second axis 62 substantially orthogonally. However, the configuration is not limited to this. In the configuration, the first surface 66, the second surface 67, or the third surface 68 does not have to intersect with the first axis 61 and the second axis 62 substantially orthogonally as long as the first surface 66, the second surface 67, or the third surface 68 intersects with the first axis 61 and the second axis 62.

The description has been provided on the configuration in which the first input side inductor 41 is wound around the first axis 61 by a half circumference in the current combining balun 101. However, the configuration is not limited to this. The first input side inductor 41 may be configured to be wound one or more times around the first axis 61 or wound less than once around the first axis 61.

The description has been provided on the configuration in which the second input side inductor 42 is wound around the second axis 62 by a half circumference in the current combining balun 101. However, the configuration is not limited to this. The second input side inductor 42 may be configured to be wound one or more times around the second axis 62 or wound less than once around the second axis 62.

The description has been provided on the configuration in which the first output side inductor 51 and the third output side inductor 53 are wound approximately once around the first axis 61 in the current combining balun 101. However, the configuration is not limited to this. The first output side inductor 51 or the third output side inductor 53 may be configured to be wound more than once around the first axis 61 or wound less than once around the first axis 61.

The description has been provided on the configuration in which the second output side inductor 52 and the fourth output side inductor 54 are wound approximately once around the second axis 62 in the current combining balun 101. However, the configuration is not limited to this. The second output side inductor 52 or the fourth output side inductor 54 may be configured to be wound more than once around the second axis 62 or wound less than once around the second axis 62.

The description has been provided on the configuration in which the first output side inductor 51 and the fourth output side inductor 54 wind clockwise and the second output side inductor 52 and the third output side inductor 53 wind counterclockwise in the current combining balun 101 in plan view of the current combining balun viewed from the z-axis positive side. However, the configuration is not limited to this. A configuration may be employed in which the first output side inductor 51 and the fourth output side inductor 54 wind counterclockwise and the second output side inductor 52 and the third output side inductor 53 wind clockwise.

The description has been provided on the configuration in which the second direction intersects with the first direction substantially orthogonally in the current combining balun 101. However, the configuration is not limited to this. In the configuration, the second direction does not have to intersect with the first direction substantially orthogonally as long as the second direction intersects with the first direction.

The description has been provided on the configuration in which two current combining baluns 101 are aligned along the x axis in the differential amplification circuit 12. However, the configuration is not limited to this. A configuration may be employed in which three or more current combining baluns 101 are aligned along the x axis.

The description has been provided on the configuration of the differential amplification device that is provided with the current combining balun 101 that combines currents which are respectively induced by the first output side inductor 51, the second output side inductor 52, the third output side inductor 53, and the fourth output side inductor 54. However, the configuration is not limited to this. The differential amplification device may be configured to include a current combining balun that combines voltages which are respectively generated in the first output side inductor 51, the second output side inductor 52, the third output side inductor 53, and the fourth output side inductor 54.

Fourth Embodiment

A differential amplification device according to a fourth embodiment will be described.

Figure 18:
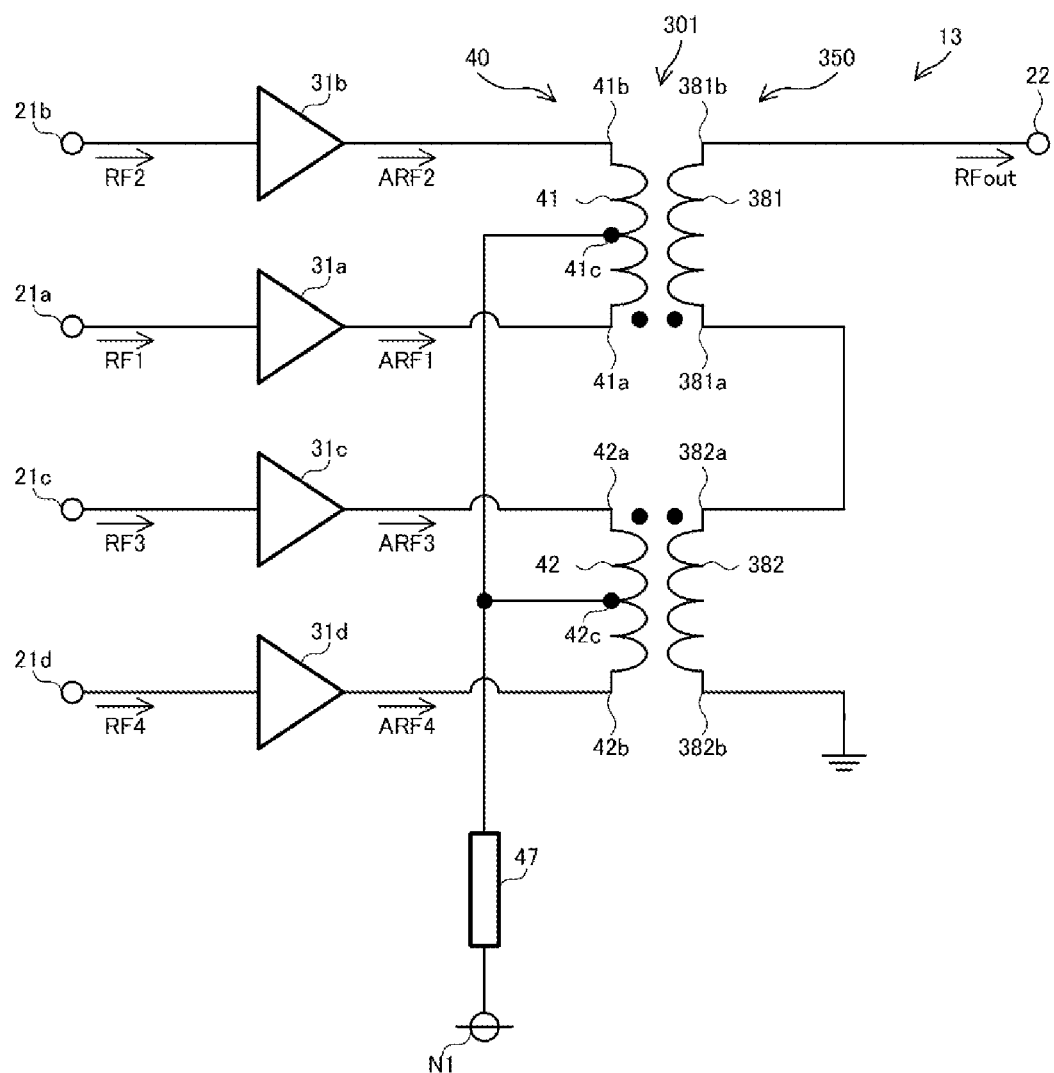
FIG. 18 is a circuit diagram of a differential amplification circuit 13.

FIG. 18 is a circuit diagram of a differential amplification circuit 13. As illustrated in FIG. 18, the differential amplification circuit 13 according to the fourth embodiment is different from the differential amplification circuit 11 according to the first embodiment in that voltages generated in output side inductors are combined with each other.

The differential amplification circuit 13 is a circuit provided to a differential amplification device and includes a voltage combining balun 301 instead of the current combining balun 101, compared to the differential amplification circuit 11 illustrated in FIG. 1. The voltage combining balun 301 includes an output unit 350 instead of the output unit 50, compared to the current combining balun 101 illustrated in FIG. 1. The output unit 350 includes an output side inductor 381 and an output side inductor 382.

The output side inductor 381 in the output unit 350 is electromagnetically coupled mainly with the first input side inductor 41 and generates an output voltage based on an electromagnetic field that is generated by the first amplified signal ARF1 and the second amplified signal ARF2 which are supplied to the first input side inductor 41. The output voltage will be described in detail later. In the present embodiment, the output side inductor 381 has a first end 381a and a second end 381b that is connected with the output terminal 22. Described in detail later, the output side inductor 381 is configured by connecting two inductors in series.

The output side inductor 382 in the output unit 350 is electromagnetically coupled mainly with the second input side inductor 42 and generates an output voltage based on an electromagnetic field that is generated by the third amplified signal ARF3 and the fourth amplified signal ARF4 which are supplied to the second input side inductor 42. The output voltage will be described in detail later. In the present embodiment, the output side inductor 382 has a first end 382a, which is connected with the first end of the output side inductor 381, and a second end 382b which is grounded. Described in detail later, the output side inductor 382 is configured by connecting two inductors in series.

[Layout]

Figure 19:
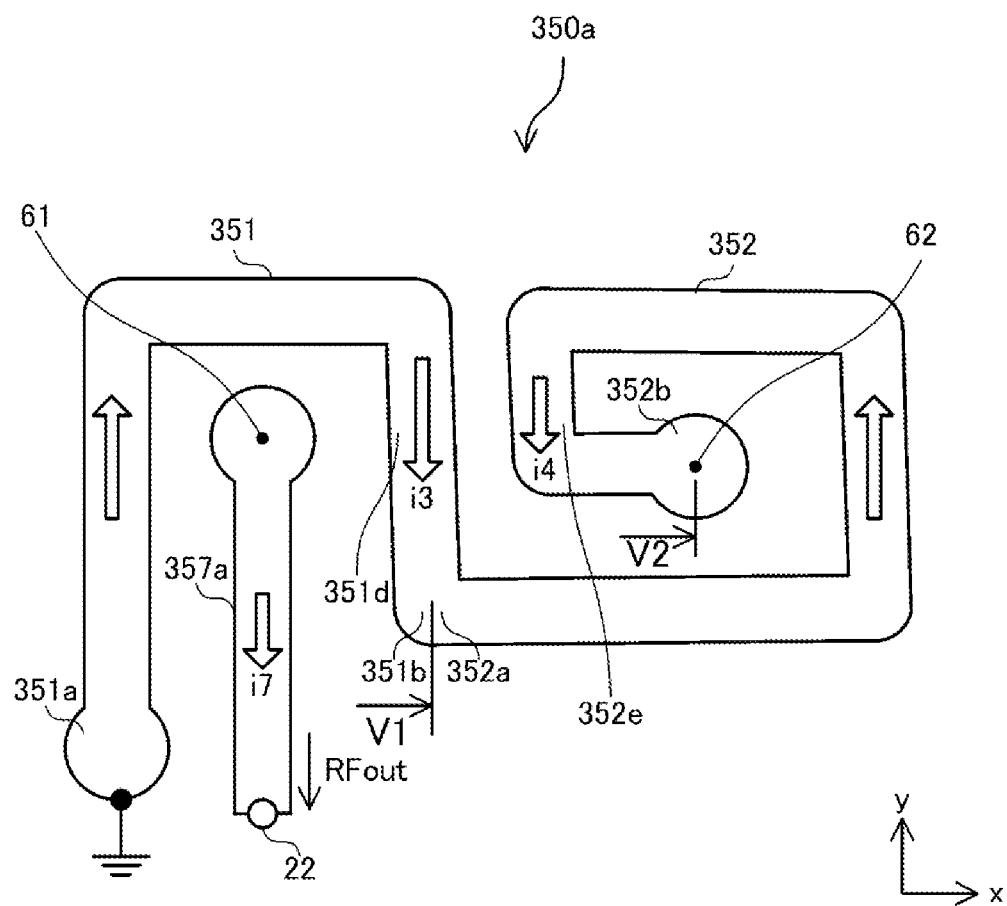
FIG. 19 illustrates an example of a layout of an upper inductor set 350a in a voltage combining balun 301.
Figure 20:
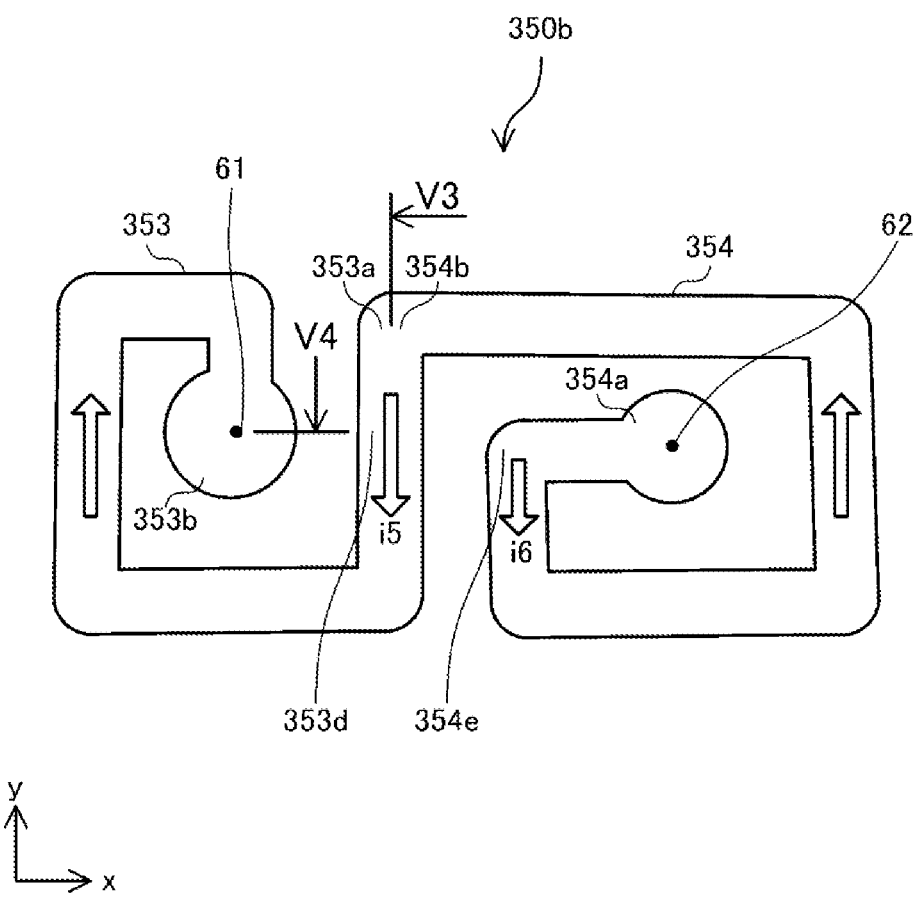
FIG. 20 illustrates an example of a layout of a lower inductor set 350b in the voltage combining balun 301.

FIG. 19 illustrates an example of a layout of an upper inductor set 350a in the voltage combining balun 301. FIG. 20 illustrates an example of a layout of a lower inductor set 350b in the voltage combining balun 301. The way of reading FIGS. 19 and 20 is the same as that of FIGS. 4 and 5.

The output unit 350 includes the upper inductor set 350a and the lower inductor set 350b as illustrated in FIG. 3 and FIGS. 18 to 20. The input unit 40 (see FIG. 3) is provided on the second layer along the first surface 66 (see FIG. 2). The upper inductor set 350a illustrated in FIG. 19 is provided on the first layer along the second surface 67 (see FIG. 2). The lower inductor set 350b illustrated in FIG. 20 is provided on the third layer along the third surface 68 (see FIG. 2).

The upper inductor set 350a illustrated in FIG. 19 includes a first output side inductor 351 (first output side conductive member) and a second output side inductor 352 (second output side conductive member). The lower inductor set 350b includes a third output side inductor 353 (third output side conductive member) and a fourth output side inductor 354 (fourth output side conductive member).

The first output side inductor 351 in the upper inductor set 350a is positioned on the z-axis positive side of the first input side inductor 41 and is wound around the first axis 61. More specifically, the first output side inductor 351 has a first end 351a, which is grounded, and a second end 351b, in plan view of the upper inductor set 350a viewed from the z-axis positive side. The first output side inductor 351 winds clockwise by less than 360° from the first end 351a to the second end 351b in the plan view.

The second output side inductor 352 is positioned on the z-axis positive side of the second input side inductor 42. The second output side inductor 352 is positioned on the x-axis positive side of the first output side inductor 351 and is wound around the second axis 62 in the winding direction of the first output side inductor 351.

More specifically, the second output side inductor 352 has a first end 352a and a second end 352b. The first end 352a is connected with the second end 351b of the first output side inductor 351, and the second end 352b is provided on a position overlapped with the second axis 62 in plan view of the upper inductor set 350a viewed from the z-axis positive side. The second output side inductor 352 winds clockwise by approximately 360° from the second end 352b to the first end 352a in a manner to separate from the second axis 62, in the plan view. This configuration can shorten the entire length of the second output side inductor 352.

The first output side inductor 351 has a third portion 351*d* that faces the first portion 41*h* of the first input side inductor 41. The third portion 351*d* is positioned between the first axis 61 and the second axis 62.

The second output side inductor 352 has a fourth portion 352*e* that faces the second portion 42*h* of the second input side inductor 42. The fourth portion 352*e* is positioned between the third portion 351*d* and the second axis 62.

The first output current i3 based on the first input current i1 flows through the third portion 351*d*. More specifically, in response to change of a magnetic field that is generated mainly by the first input current i1 flowing through the first input side inductor 41, an electric field is generated along a direction in which the first output side inductor 351 is wound, in the first output side inductor 351. In accordance with the electric field thus generated, a voltage is generated between the first end 351*a* and the second end 351*b* of the first output side inductor 351. Here, a potential of the second end 351*b* with respect to the first end 351*a*, that is, with respect to a ground is denoted as V1. The first output current i3 flows through the third portion 351*d* based on the voltage between the first end 351*a* and the second end 351*b*.

The second output current i4 based on the second input current i2 flows through the fourth portion 352*e* in the same direction as the first output current i3. More specifically, in response to change of a magnetic field that is generated mainly by the second input current i2 flowing through the second input side inductor 42, an electric field is generated along a direction in which the second output side inductor 352 is wound, in the second output side inductor 352. In accordance with the electric field thus generated, a voltage is generated between the first end 352*a* and the second end 352*b* of the second output side inductor 352. Here, a potential of the second end 352*b* with respect to the first end 352*a* is denoted as V2. The direction of the magnetic field generated by the first input current i1 is opposite to the direction of the magnetic field generated by the second input current i2 as described above and therefore, the second output current i4 having the same direction as the first output current i3 flows through the fourth portion 352*e* in accordance with the electric field in the second output side inductor 352.

The third output side inductor 353 and the fourth output side inductor 354 in the lower inductor set 350*b* illustrated in FIG. 20 are wound in the opposite direction to the winding direction of the first output side inductor 351 or the second output side inductor 352 in the upper inductor set 350*a*.

More specifically, the fourth output side inductor 354 in the lower inductor set 350*b* is positioned on the z-axis negative side of the second input side inductor 42 and is wound around the second axis 62 in the opposite direction to the winding direction of the first output side inductor 351 or the second output side inductor 352. More specifically, the fourth output side inductor 354 has a first end 354*a* that is provided on a position overlapped with the second axis 62 in plan view of the lower inductor set 350*b* viewed from the z-axis positive side and a second end 354*b*. The fourth output side inductor 354 winds counterclockwise by approximately 360° from the first end 354*a* to the second end 354*b* in a manner to separate from the second axis 62, in the plan view. The first end 354*a* is connected with the second end 352*b* of the second output side inductor 352 through the via 56*b* (see FIG. 2 and FIG. 19).

The third output side inductor 353 is positioned on the z-axis negative side of the first input side inductor 41. The third output side inductor 353 is positioned on the x-axis negative side of the fourth output side inductor 354 and is wound around the first axis 61 in the opposite direction to the winding direction of the first output side inductor 351 or the second output side inductor 352. In other words, the third output side inductor 353 is wound around the first axis 61 in the winding direction of the fourth output side inductor 354.

More specifically, the third output side inductor 353 has a first end 353*a* and a second end 353*b*. The first end 353*a* is connected with the second end 354*b* of the fourth output side inductor 354, and the second end 353*b* is provided on a position overlapped with the first axis 61 in plan view of the lower inductor set 350*b* viewed from the z-axis positive side. The third output side inductor 353 winds counterclockwise by approximately 360° from the second end 353*b* to the first end 353*a* in a manner to separate from the first axis 61, in the plan view.

The third output side inductor 353 has a fifth portion 353*d* that is opposed to the third portion 351*d* of the first output side inductor 351 with the first portion 41*h* of the first input side inductor 41 interposed therebetween. The fifth portion 353*d* is positioned between the first axis 61 and the second axis 62.

The fourth output side inductor 354 has a sixth portion 354*e* that is opposed to the fourth portion 352*e* of the second output side inductor 352 with the second portion 42*h* of the second input side inductor 42 interposed therebetween. The sixth portion 354*e* is positioned between the fifth portion 353*d* and the second axis 62.

The fourth output current i6 based on the second input current i2 flows through the sixth portion 354*e*. More specifically, in response to change of a magnetic field that is generated mainly by the second input current i2 flowing through the second input side inductor 42, an electric field is generated along a direction in which the fourth output side inductor 354 is wound, in the fourth output side inductor 354. In accordance with the electric field thus generated, a voltage is generated between the first end 354*a* and the second end 354*b* of the fourth output side inductor 354. Here, a potential of the second end 354*b* with respect to the first end 354*a*, that is, with respect to the second end 352*b* of the second output side inductor 352 is denoted as V3. The fourth output current i6 flows through the fourth output side inductor 354 based on the voltage between the first end 354*a* and the second end 354*b*.

The third output current i5 based on the first input current i1 flows through the fifth portion 353*d* in the same direction as the fourth output current i6. More specifically, in response to change of a magnetic field that is generated mainly by the first input current i1 flowing through the first input side inductor 41, an electric field is generated along a direction in which the third output side inductor 353 is wound, in the third output side inductor 353. In accordance with the electric field thus generated, a voltage is generated between the first end 353*a* and the second end 353*b* of the third output side inductor 353. Here, a potential of the second end 353*b* with respect to the first end 353*a* is denoted as V4. The direction of the magnetic field generated by the first input current i1 is opposite to the direction of the magnetic field generated by the second input current i2 as described above and therefore, the third output current i5 having the same direction as the fourth output current i6 flows through the fifth portion 353*d* in accordance with the electric field in the third output side inductor 353.

A connection conductive member 357*a* illustrated in FIG. 19 is, for example, a straight member that extends along the y axis in plan view of the lower inductor set 350*b* viewed from the z axis positive side, and has a first end and a second end. The first end is connected with the second end 353b of the third output side inductor 353 through the via 56a. The second end is the output terminal 22.

The output terminal 22 outputs a combined output voltage that is obtained by combining voltages generated in the first output side inductor 351 (see FIG. 19), the second output side inductor 352 (see FIG. 19), the third output side inductor 353 (see FIG. 20), and the fourth output side inductor 354 (see FIG. 20) respectively. Specifically, the first output side inductor 351, the second output side inductor 352, the third output side inductor 353, and the fourth output side inductor 354 are connected in series and therefore, the output terminal 22 has a potential of (V1+V2+V3+V4) with respect to the ground.

Further, the first output side inductor 351 and the second output side inductor 352 function as the output side inductor 381 (see FIG. 18). The second output side inductor 352 and the fourth output side inductor 354 function as the output side inductor 382 (see FIG. 18).

In the above description, the voltage combining balun 301 has the configuration in which the upper inductor set 350a and the lower inductor set 350b are provided on the first layer and the third layer respectively. However, the configuration is not limited to this. The voltage combining balun 301 may be configured to include either one of the upper inductor set 350a on the first layer and the lower inductor set 350b on the third layer.

The description has been provided on the configuration in which one voltage combining balun 301 is provided in the differential amplification circuit 13. However, the configuration is not limited to this. A configuration may be employed in which two or more voltage combining baluns 301 are aligned along the x axis.

The description has been provided on the configuration in which the voltage combining balun 301 includes the input unit 40 in the differential amplification circuit 13. However, the configuration is not limited to this. The voltage combining balun 301 may be configured to include the input unit 240 (see FIG. 13) instead of the input unit 40.

Fifth Embodiment

A differential amplification device according to a fifth embodiment will be described.

Figure 21:
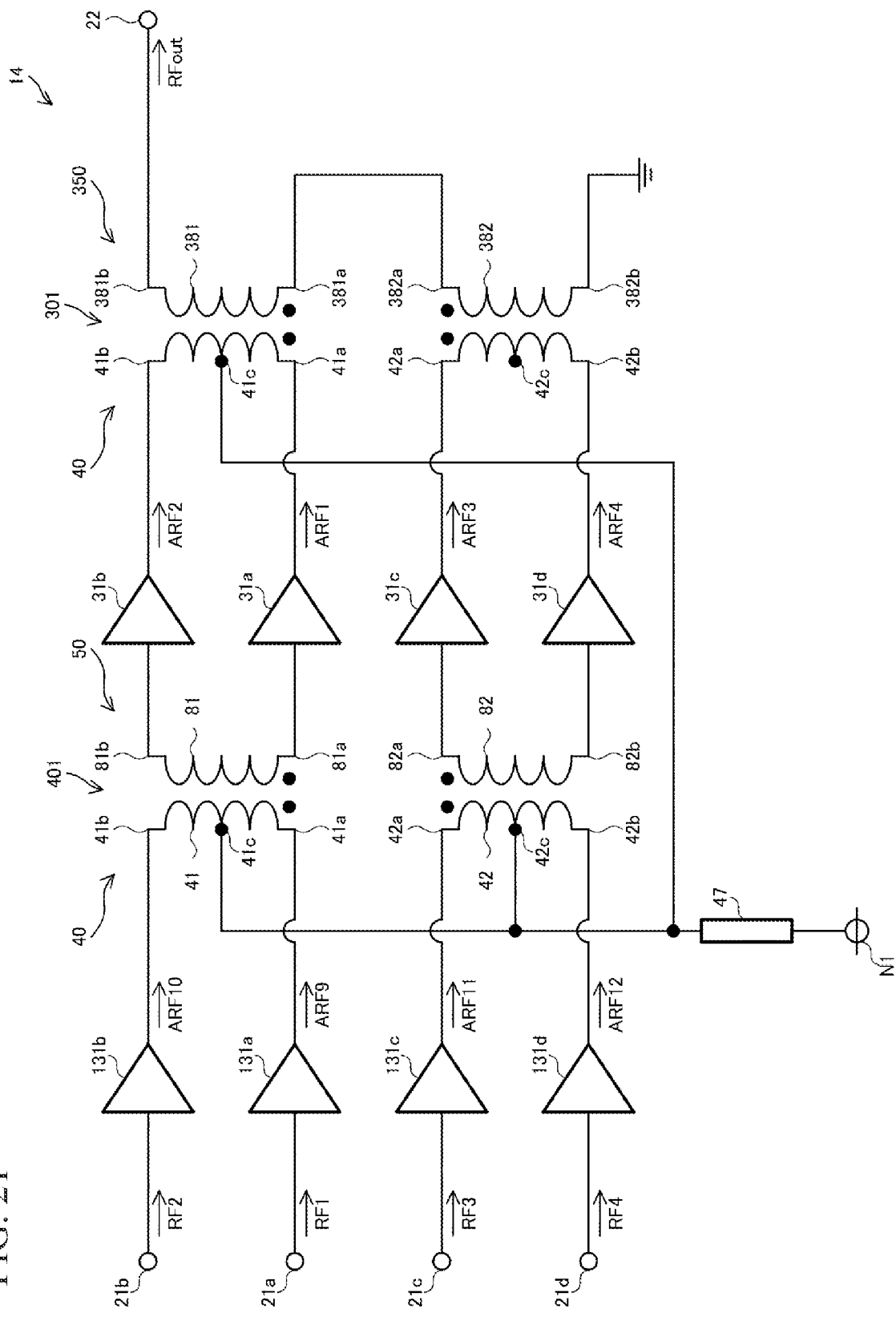
FIG. 21 is a circuit diagram of a differential amplification circuit 14.

FIG. 21 is a circuit diagram of a differential amplification circuit 14. As illustrated in FIG. 21, the differential amplification circuit 14 according to the fifth embodiment is different from the differential amplification circuit 13 according to the fourth embodiment in that two differential pairs of a driver stage are provided on the previous stage of the first amplifier 31a, second amplifier 31b, third amplifier 31c, and fourth amplifier 31d.

The differential amplification circuit 14 is a circuit provided to a differential amplification device and further includes a balun 401, a first amplifier 131a, a second amplifier 131b, a third amplifier 131c, and a fourth amplifier 131d, compared to the differential amplification circuit 13 illustrated in FIG. 18. The balun 401 has a similar configuration to the configuration of the current combining balun 101 illustrated in FIG. 1.

The first amplifier 131a and the second amplifier 131b constitute the first driver-stage differential pair. The third amplifier 131c and the fourth amplifier 131d constitute the second driver-stage differential pair.

The first amplifier 31a and the second amplifier 31b constitute the first power-stage differential pair. The third amplifier 31c and the fourth amplifier 31d constitute the second power-stage differential pair.

The balun 401 is provided between the two driver-stage differential pairs and the two power-stage differential pairs and functions as an inter-stage matching circuit.

Specifically, the first amplifier 131a has an input terminal, which is connected with the input terminal 21a, and an output terminal, which is connected with the first end 41a of the first input side inductor 41 in the balun 401. The first amplifier 131a amplifies the first signal RF1 supplied to the input terminal thereof through the input terminal 21a and outputs an amplified signal ARF9 from the output terminal thereof.

The second amplifier 131b has an input terminal, which is connected with the input terminal 21b, and an output terminal, which is connected with the second end 41b of the first input side inductor 41 in the balun 401. The second amplifier 131b amplifies the second signal RF2 supplied to the input terminal thereof through the input terminal 21b and outputs an amplified signal ARF10 from the output terminal thereof.

The third amplifier 131c has an input terminal, which is connected with the input terminal 21c, and an output terminal, which is connected with the first end 42a of the second input side inductor 42 in the balun 401. The third amplifier 131c amplifies the third signal RF3 supplied to the input terminal thereof through the input terminal 21c and outputs an amplified signal ARF11 from the output terminal thereof.

The fourth amplifier 131d has an input terminal, which is connected with the input terminal 21d, and an output terminal, which is connected with the second end 42b of the second input side inductor 42 in the balun 401. The fourth amplifier 131d amplifies the fourth signal RF4 supplied to the input terminal thereof through the input terminal 21d and outputs an amplified signal ARF12 from the output terminal thereof.

The first end 81a and the second end 81b of the output side inductor 81 in the balun 401 are connected with the input terminal of the first amplifier 31a and the input terminal of the second amplifier 31b respectively. The first end 82a and the second end 82b of the output side inductor 82 in the balun 401 are connected with the input terminal of the third amplifier 31c and the input terminal of the fourth amplifier 31d respectively.

Thus, the balun 401 that has a high coupling coefficient among inductors is provided as an inter-stage matching circuit. This configuration can increase an impedance conversion ratio. Accordingly, even when an input impedance of two power-stage differential pairs is reduced to increase an output, for example, impedances between the two driver-stage differential pairs and the two power-stage differential pairs can be favorably matched.

The description has been provided on the configuration of the differential amplification circuit 14 that is provided with the voltage combining balun 301 on the subsequent stage of the two power-stage differential pairs. However, the configuration is not limited to this. The differential amplification circuit 14 may be configured to be provided with the current combining balun 101 on the subsequent stage of the two power-stage differential pairs.

The exemplary embodiments of the present invention have been described above. A combining balun includes: the first input side inductor 41 that is wound around the first axis 61 on the first surface 66, which intersects with the first axis 61, and has the first portion 41h which is positioned between the second axis 62, which is substantially parallel to the first axis 61, and the first axis 61 and through which the first input current i1 flows; the second input side inductor 42 that is wound around the second axis 62 on the first surface 66 and has the second portion 42h which is positioned between the second axis 62 and the first portion 41h and through which the second input current i2 flows in the same direction as the direction of the first input current i1; the first output side inductor 51 that is wound around the first axis 61 on the second surface 67, which faces the first surface 66, and has the third portion 51d which faces the first portion 41h; the second output side inductor 52 that is wound around the second axis 62 on the second surface 67 and has the fourth portion 52e which faces the second portion 42h; and the first output terminal 55a that outputs a current or a voltage, which is generated in the first output side inductor 51 and the second output side inductor 52, based on the first input current i1 and the second input current i2.

This configuration can make the direction of the magnetic field that is generated by the first input current i1 in the inner side portion 41i of the first input side inductor 41 be opposite to the direction of the magnetic field that is generated by the second input current i2 in the inner side portion 42i of the second input side inductor 42. That is, the direction of the magnetic field generated by the first input current i1 in the inner side portion 41i of the first input side inductor 41 and the direction of the magnetic field generated by the second input current i2 in the outer side portion 42j of the second input side inductor 42 are the same as each other and further, the direction of the magnetic field generated by the first input current i1 in the outer side portion 41j of the first input side inductor 41 and the direction of the magnetic field generated by the second input current i2 in the inner side portion 42i of the second input side inductor 42 are the same as each other. Accordingly, the magnetic field generated by the first input current i1 in the inner side portion 41i of the first input side inductor 41 is strengthened by the magnetic field generated by the second input current i2 in the outer side portion 42j of the second input side inductor 42 and also, the magnetic field generated by the second input current i2 in the inner side portion 42i of the second input side inductor 42 is strengthened by the magnetic field generated by the first input current i1 in the outer side portion 41j of the first input side inductor 41. Thus, a coupling coefficient among inductors in the combining balun can be increased, that is, the combining balun can be brought closer to an ideal transformer. This can reduce leakage inductance, improve an impedance conversion ratio of the combining balun, and suppress efficiency degradation in converting from a differential signal to a single phase signal. Further, the combining balun can be used as an inter-stage matching circuit that matches impedances between two driver-stage differential pairs and two power-stage differential pairs. Here, even when the impedance of the two driver-stage differential pairs is largely different from the impedance of the two power-stage differential pairs, the impedance of the two driver-stage differential pairs and the impedance of the two power-stage differential pairs can be favorably matched.

In the input unit 40 in the current combining balun 101, the first input side inductor 41 and the second input side inductor 42 have a U shape that is opened in a second direction, which intersects with a first direction that is directed from the first axis 61 toward the second axis 62, on the first surface 66.

With the configuration in which the first input side inductor 41 and the second input side inductor 42 have the U shapes that are opened in the mutually-same direction, the first amplifier 31a, the second amplifier 31b, the third amplifier 31c, and the fourth amplifier 31d can be aligned on the first surface 66. This can realize simple wiring around these amplifiers. Specifically, for example, wiring between the first, second amplifiers 31a, 31b and the first input side inductor 41, wiring between the third, fourth amplifiers 31c, 31d and the second input side inductor 42, and wiring between a circuit on the previous stage and each amplifier can be simplified. Further, forming each amplifier can be simplified.

In the input unit 240 in the differential amplification circuit 11, the first input side inductor 41 has a U shape that is opened in a second direction, which intersects with the first direction, on the first surface 66. Further, the second input side inductor 42 has a U shape that is opened in a third direction, which is an opposite direction to the second direction.

With the configuration in which the first input side inductor 41 and the second input side inductor 42 have the U shapes that are opened in the opposite directions to each other, the first amplifier 31a and the second amplifier 31b can be arranged on the y-axis positive side of the first input side inductor 41 and the third amplifier 31c and the fourth amplifier 31d can be arranged on the y-axis negative side of the second input side inductor 42, for example.

Further, in the differential amplification circuit 11, the second input side inductor 42 has a shape that is substantially symmetrical to the first input side inductor 41 across the symmetry plane 63 that is positioned between the first axis 61 and the second axis 62.

This configuration can align the magnetic field generated by the first input side inductor 41 with the magnetic field generated by the second input side inductor 42, being able to make it easier to align characteristics in converting from a first differential signal to a single end signal with characteristics in converting from a second differential signal to a single end signal. Further, a compact arrangement can be realized as a whole and each inductor can be designed to have a shape with which favorable characteristics are exerted.

In the current combining balun 101 in the differential amplification circuit 11, the second output side inductor 52 is wound around the second axis 62 in the opposite direction to the winding direction of the first output side inductor 51. The first output current i3 based on the first input current i1 flows through the third portion 51d. The second output current i4 based on the second input current i2 flows through the fourth portion 52e in the same direction as the first output current i3. The first output terminal 55a outputs the combined output current i7 that is obtained by combining the first output current i3 and the second output current i4 with each other.

This configuration can provide a function as the current combining balun that inputs the first input current i1 and the second input current i2 constituting a differential signal into the first input side inductor 41 and the second input side inductor 42 respectively and outputs the combined output current i7 as a single phase signal.

The current combining balun 101 further includes: the third output side inductor 53 that is wound around the first axis 61 in the opposite direction on the third surface 68, which is opposed to the second surface 67 with the first surface 66 interposed therebetween, has the fifth portion 53d which is opposed to the third portion 51d with the first portion 41h interposed therebetween, and is connected with the first output side inductor 51 in series; and the fourth output side inductor 54 that is wound around the second axis 62 in the winding direction on the third surface 68, has the sixth portion 54e which is opposed to the fourth portion 52e with the second portion 42h interposed therebetween, and is connected with the second output side inductor 52 in series. The third output current i5 based on the first input current i1 flows through the fifth portion 53d. The fourth output current i6 based on the second input current i2 flows through the sixth portion 54e in the same direction as the third output current i5.

This configuration can raise current supply capability of the current combining balun 101, increase a coupling coefficient of the current combining balun 101, and effectively suppress efficiency degradation in converting from a differential signal to a single phase signal.

Further, in the differential amplification circuit 11, the second output side inductor 52 has a shape that is substantially symmetrical to the first output side inductor 51 across the symmetry plane 63 that is positioned between the first axis 61 and the second axis 62.

This configuration can make it easier to align characteristics in converting from a first differential signal to a single end signal with characteristics in converting from a second differential signal to a single end signal, being able to output the first output current i3 and the second output current i4 in a well-balanced manner. Further, a compact arrangement can be realized as a whole and each inductor can be designed in a shape with which favorable characteristics are exerted.

In the voltage combining balun 301 in the differential amplification circuit 13, the second output side inductor 352 is wound in the winding direction of the first output side inductor 351 and is connected with the first output side inductor 351 in series. The first output current i3 based on the first input current i1 flows through the third portion 351d. The second output current i4 based on the second input current i2 flows through the fourth portion 352e in the same direction as the first output current i3. The output terminal 22 outputs a combined output voltage that is obtained by combining voltages, which are generated in the first output side inductor 351 and the second output side inductor 352 respectively, with each other.

This configuration can provide a function as the voltage combining balun that inputs the first input current i1 and the second input current i2 constituting a differential signal into the first input side inductor 41 and the second input side inductor 42 respectively and outputs a combined output voltage as a single phase signal.

The voltage combining balun 301 further includes: the third output side inductor 353 that is wound around the first axis 61 in the opposite direction on the third surface 68, which is opposed to the second surface 67 with the first surface 66 interposed therebetween, has the fifth portion 353d which is opposed to the third portion 351d with the first portion 41h interposed therebetween, and is connected with the first output side inductor 351 in series; and the fourth output side inductor 354 that is wound around the second axis 62 in the opposite direction on the third surface 68, has the sixth portion 354e which is opposed to the fourth portion 352e with the second portion 42h interposed therebetween, and is connected with the first output side inductor 351 in series. The output terminal 22 outputs a combined output voltage that is obtained by combining voltages, which are generated in the first output side inductor 351, the second output side inductor 352, the third output side inductor 353, and the fourth output side inductor 354 respectively, with each other.

This configuration can raise a voltage outputted by the voltage combining balun 301, increase a coupling coefficient of the voltage combining balun 301, and effectively suppress efficiency degradation in converting from a differential signal to a single phase signal.

Further, in the differential amplification circuit 12, two sets, each of which includes the first input side inductor 41, the second input side inductor 42, the first output side inductor 51, the second output side inductor 52, and the first output terminal 55a, are provided along the first direction.

This configuration can convert first to fourth differential signals into four respective single end signals and combine these four single end signals to output the combined signal. Accordingly, a load per amplifier can be reduced and therefore, the output of the differential amplification circuit 12 can be raised. Further, for example, when output is performed at the same power as the differential amplification circuit 11 including four amplifiers, a load per amplifier is reduced and therefore, output impedance relative to the amplifier can be increased. This can raise an output voltage of each amplifier. That is, compared to each amplifier included in the differential amplification circuit 11, a gain of each amplifier included in the differential amplification circuit 12 can be increased.

A differential amplification device includes: the first amplifier 31a that amplifies the first signal RF1 and outputs the first amplified signal ARF1; the second amplifier 31b that amplifies the second signal RF2, which has a phase that is different from a phase of the first signal RF1, and outputs the second amplified signal ARF2; the third amplifier 31c that amplifies the third signal RF3, which has a phase that is substantially the same phase as the phase of the first signal RF1, and outputs the third amplified signal ARF3; the fourth amplifier 31d that amplifies the fourth signal RF4, which has a phase that is substantially the same phase as the phase of the second signal RF2, and outputs the fourth amplified signal ARF4; the first input side inductor 41 that is wound around the first axis 61 on the first surface 66, which intersects with the first axis 61, and has the first end 41a which is connected with the first amplifier 31a, the first portion 41h which is positioned between the second axis 62, which is substantially parallel to the first axis 61, and the first axis 61 and through which the first input current i1 flows, and the second end 41b which is connected with the second amplifier 31b; the second input side inductor 42 that is wound around the second axis 62 on the first surface 66, and has the first end 42a which is connected with the third amplifier 31c, the second portion 42h which is positioned between the second axis 62 and the first portion 41h and through which the second input current i2 flows in the same direction as the direction of the first input current i1, and the second end 42b which is connected with the fourth amplifier 31d; the first output side inductor 51 that is wound around the first axis 61 on the second surface 67, which faces the first surface 66, and has the third portion 51d which faces the first portion 41h; the second output side inductor 52 that is wound around the second axis 62 on the second surface 67 and has the fourth portion 52e which faces the second portion 42h; and the first output terminal 55a that outputs a current or a voltage, which is generated in the first output side inductor 51 and the second output side inductor 52, based on the first input current i1 and the second input current i2.

This configuration can make the direction of the magnetic field that is generated by the first input current i1 in the inner side portion 41i of the first input side inductor 41 be opposite to the direction of the magnetic field that is generated by the second input current i2 in the inner side portion 42i of the second input side inductor 42. That is, the direction of the magnetic field generated by the first input current i1 in the inner side portion 41i of the first input side inductor 41 and the direction of the magnetic field generated by the second input current i2 in the outer side portion 42j of the second input side inductor 42 are the same as each other and further, the direction of the magnetic field generated by the first input current i1 in the outer side portion 41j of the first input side inductor 41 and the direction of the magnetic field generated by the second input current i2 in the inner side portion 42i of the second input side inductor 42 are the same as each other. Accordingly, the magnetic field generated by the first input current i1 in the inner side portion 41i of the first input side inductor 41 is strengthened by the magnetic field generated by the second input current i2 in the outer side portion 42j of the second input side inductor 42 and also, the magnetic field generated by the second input current i2 in the inner side portion 42i of the second input side inductor 42 is strengthened by the magnetic field generated by the first input current i1 in the outer side portion 41j of the first input side inductor 41. Thus, a coupling coefficient among inductors in the combining balun can be increased, that is, the combining balun can be brought closer to an ideal transformer. This can reduce leakage inductance, improve an impedance conversion ratio of the combining balun, and suppress efficiency degradation in converting from a differential signal to a single phase signal. Further, the combining balun can be used as an inter-stage matching circuit that matches impedances between two driver-stage differential pairs and two power-stage differential pairs. Here, even when the impedance of the two driver-stage differential pairs is largely different from the impedance of the two power-stage differential pairs, the impedance of the two driver-stage differential pairs and the impedance of the two power-stage differential pairs can be favorably matched.

Further, first and second differential signals can be converted into two respective single end signals and these two single end signals can be combined to be outputted. Accordingly, a load per amplifier can be reduced and therefore, the output of the differential amplification device can be raised. Further, for example, when output is performed at the same power as the differential amplification circuit including two amplifiers, a load per amplifier is reduced and therefore, output impedance relative to the amplifier can be increased. This can raise an output voltage of each amplifier. That is, compared to each amplifier included in the differential amplification circuit, a gain of each amplifier included in the differential amplification device can be increased.

It should be noted that each of the embodiments is described above for facilitating the understanding of the present invention, and is not described for limiting the interpretation of the present invention. The present invention can be modified/improved without necessarily departing from the spirit thereof, and the present invention also includes an equivalent thereof. That is, each embodiment whose design is appropriately changed by those skilled in the art is also included in the scope of the present invention as long as the embodiment has the features of the present invention. For example, elements included in each embodiment and those arrangement, materials, conditions, shapes, sizes, and the like are not limited to those exemplified, and can be appropriately changed. Further, each of the embodiments is exemplary and it goes without necessarily saying that partial substitution or combination of the configurations described in different embodiments can be performed, and this is also included in the scope of the present invention as long as the features of the present invention are included.

What is claimed is:

1. A combining balun comprising:
   a first input side conductor that is wound around a first axis on a first surface and that has a first portion which is positioned between a second axis and through which a first input current flows and the first axis, the first surface intersecting with the first axis, and the second axis being parallel to the first axis;
   a second input side conductor that is wound around the second axis on the first surface and that has a second portion which is positioned between the second axis and the first portion and through which a second input current flows in a same direction as a direction of the first input current;
   a first output side conductor that is wound around the first axis on a second surface and that has a third portion which faces the first portion, the second surface facing the first surface;
   a second output side conductor that is wound around the second axis on the second surface and that has a fourth portion which faces the second portion; and
   an output terminal that outputs a current or a voltage, the current or the voltage being generated in the first output side conductor and the second output side conductor based on the first input current and the second input current.

2. The combining balun according to claim 1, wherein the first input side conductor and the second input side conductor have a U shape that is opened in a second direction, the second direction intersecting with a first direction that is from the first axis toward the second axis on the first surface.

3. The combining balun according to claim 1, wherein:
   the first input side conductor has a U shape that is opened in a second direction, the second direction intersecting with a first direction that is from the first axis toward the second axis on the first surface, and
   the second input side conductor has a U shape that is opened in a third direction, the third direction being an opposite direction to the second direction.

4. The combining balun according to claim 1, wherein the second input side conductor has a shape that is symmetrical to the first input side conductor across a symmetry plane that is between the first axis and the second axis.

5. The combining balun according to claim 1, wherein:
   the second output side conductor is wound in an opposite direction to a winding direction of the first output side conductor,
   a first output current based on the first input current flows through the third portion,
   a second output current based on the second input current flows through the fourth portion in a same direction as the first output current, and
   the output terminal outputs a combined output current, the combined output current being a combination of the first output current and the second output current.

6. The combining balun according to claim 5, further comprising:
   a third output side conductor that is wound around the first axis in the opposite direction on a third surface and that has a fifth portion connected with the first output side conductor in series, the third surface being opposed to the second surface with the first surface interposed therebetween, and the fifth portion being opposed to the third portion with the first portion interposed therebetween; and
   a fourth output side conductor that is wound around the second axis in the winding direction on the third surface and that has a sixth portion connected with the second output side conductor in series, the sixth portion being opposed to the fourth portion with the second portion interposed therebetween, wherein a third output current based on the first input current flows through the fifth portion, and wherein a fourth output current based on the second input current flows through the sixth portion in a same direction as the third output current.

7. The combining balun according to claim 5, wherein the second output side conductor has a shape that is symmetrical to the first output side conductor across a symmetry plane that is between the first axis and the second axis.

8. The combining balun according to claim 1, wherein:

the second output side conductor is wound in a winding direction of the first output side conductor and is connected with the first output side conductor in series, a first output current based on the first input current flows through the third portion, a second output current based on the second input current flows through the fourth portion in a same direction as the first output current, and the output terminal outputs a combined output voltage that is obtained by combining voltages, the voltages being generated in the first output side conductor and the second output side conductor respectively, with each other.

9. The combining balun according to claim 8, further comprising:

a third output side conductor that is wound around the first axis in an opposite direction to the winding direction on a third surface and that has a fifth portion connected with the first output side conductor in series, the third surface being opposed to the second surface with the first surface interposed therebetween, and the fifth portion being opposed to the third portion with the first portion interposed therebetween; and a fourth output side conductor that is wound around the second axis in the opposite direction on the third surface and that has a sixth portion connected with the first output side conductor in series, the sixth portion being opposed to the fourth portion with the second portion interposed therebetween, wherein the output terminal outputs a combined output voltage that is obtained by combining voltages, the voltages being generated in the first output side conductor, the second output side conductor, the third output side conductor, and the fourth output side conductor respectively, with each other.

10. The combining balun according to claim 1, further comprising:

a plurality of sets of the first input side conductor, the second input side conductor, the first output side conductor, the second output side conductor, and the output terminal, wherein the plurality of sets are along the first direction that is from the first axis toward the second axis.

11. A differential amplification device comprising:

a first amplifier configured to amplify a first signal and to output a first amplified signal;

a second amplifier configured to amplify a second signal and to output a second amplified signal, the second signal having a phase that is different from a phase of the first signal;

a third amplifier configured to amplify a third signal and to output a third amplified signal, the third signal having a phase that is a same phase as the phase of the first signal;

a fourth amplifier configured to amplify a fourth signal and to output a fourth amplified signal, the fourth signal having a phase that is a same phase as the phase of the second signal;

a first input side conductor that is wound around a first axis on a first surface, the first surface intersecting with the first axis, and that has:
 a first end which is connected with the first amplifier,
 a first portion which is positioned between a second axis and the first axis and through which a first input current flows, the second axis being parallel to the first axis, and
 a second end which is connected with the second amplifier;

a second input side conductor that is wound around the second axis on the first surface, and that has:
 a first end which is connected with the third amplifier,
 a second portion which is positioned between the second axis and the first portion and through which a second input current flows in a same direction as a direction of the first input current, and
 a second end which is connected with the fourth amplifier;

a first output side conductor that is wound around the first axis on a second surface and that has a third portion which faces the first portion, the second surface facing the first surface;

a second output side conductor that is wound around the second axis on the second surface and that has a fourth portion which faces the second portion; and an output terminal that outputs a current or a voltage, the current or the voltage being generated in the first output side conductor and the second output side conductor based on the first input current and the second input current.

* * * * *

UNITED STATES PATENT AND TRADEMARK OFFICE
CERTIFICATE OF CORRECTION

PATENT NO. : 12,348,211 B2  
APPLICATION NO. : 17/648613  
DATED : July 1, 2025  
INVENTOR(S) : Masafumi Kazuno Page 1 of 1

It is certified that error appears in the above-identified patent and that said Letters Patent is hereby corrected as shown below:

In the Specification

Column 11, Line 9, "side inductor (see FIG. 1)." should be --side inductor 81 (see FIG. 1).--

Signed and Sealed this  
Nineteenth Day of August, 2025

Coke Morgan Stewart  
*Acting Director of the United States Patent and Trademark Office*